US012010844B2

(12) United States Patent
Lee et al.

(10) Patent No.: US 12,010,844 B2
(45) Date of Patent: Jun. 11, 2024

(54) SEMICONDUCTOR DEVICE AND METHOD OF MANUFACTURING THE SEMICONDUCTOR DEVICE

(71) Applicant: SK hynix Inc., Icheon-si Gyeonggi-do (KR)

(72) Inventors: Dong Hun Lee, Icheon-si Gyeonggi-do (KR); Mi Seong Park, Icheon-si Gyeonggi-do (KR); Jung Shik Jang, Icheon-si Gyeonggi-do (KR); Jung Dal Choi, Icheon-si Gyeonggi-do (KR); In Su Park, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 280 days.

(21) Appl. No.: 17/216,093

(22) Filed: Mar. 29, 2021

(65) Prior Publication Data
US 2022/0102374 A1    Mar. 31, 2022

(30) Foreign Application Priority Data
Sep. 29, 2020 (KR) .......................... 10-2020-0126712

(51) Int. Cl.
*H10B 43/27* (2023.01)
*H10B 41/27* (2023.01)
*H10B 63/00* (2023.01)

(52) U.S. Cl.
CPC ............. *H10B 43/27* (2023.02); *H10B 41/27* (2023.02); *H10B 63/34* (2023.02); *H10B 63/845* (2023.02)

(58) Field of Classification Search
None
See application file for complete search history.

(56) References Cited

U.S. PATENT DOCUMENTS

| 8,957,495 | B2 | 2/2015 | Sakui |
| 2018/0019257 | A1* | 1/2018 | Son ......................... H10B 41/27 |
| 2020/0098767 | A1* | 3/2020 | Morooka ........... H01L 29/40117 |

FOREIGN PATENT DOCUMENTS

KR    1020180008959 A    1/2018

* cited by examiner

*Primary Examiner* — Xiaoming Liu
(74) *Attorney, Agent, or Firm* — WILLIAM PARK & ASSOCIATES LTD.

(57) ABSTRACT

A semiconductor device and a method of manufacturing the semiconductor device. The semiconductor device including a stacked body including conductive patterns and insulating patterns that are alternately stacked, a filling layer configured to pass through the stacked body, a first channel layer configured to pass through the stacked body and coupled to the filling layer, a second channel layer configured to pass through the stacked body and coupled to the filling layer, a first interposed layer configured to pass through the stacked body and disposed between the first channel layer and the filling layer, a second interposed layer configured to pass through the stacked body and disposed between the second channel layer and the filling layer, and a memory layer surrounding the filling layer, the first and second channel layers, and the first and second interposed layers.

14 Claims, 29 Drawing Sheets

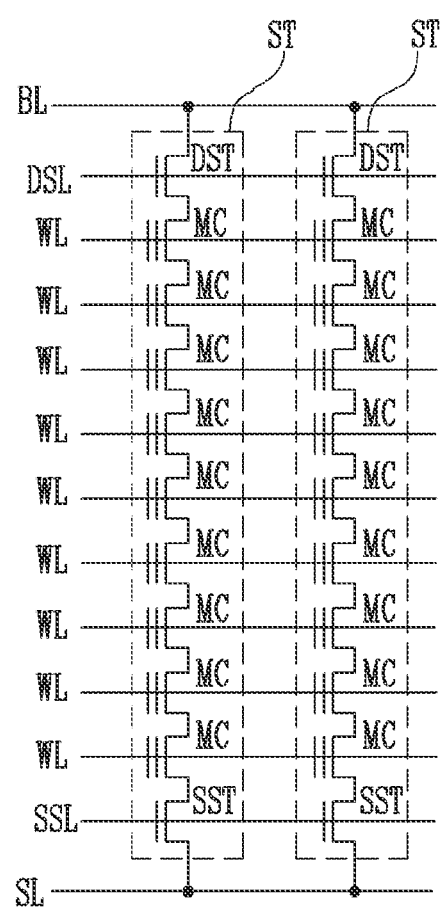

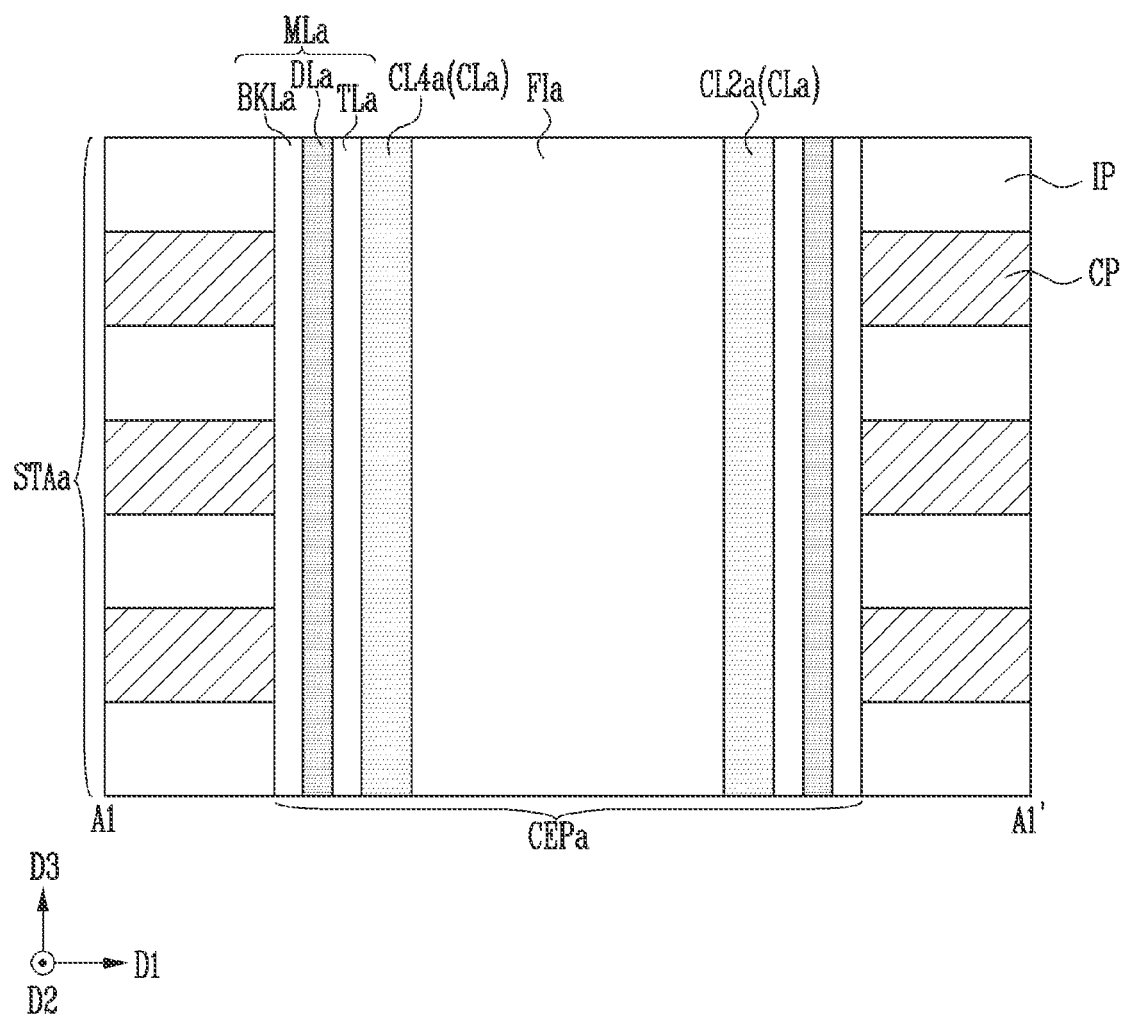

FIG. 3A
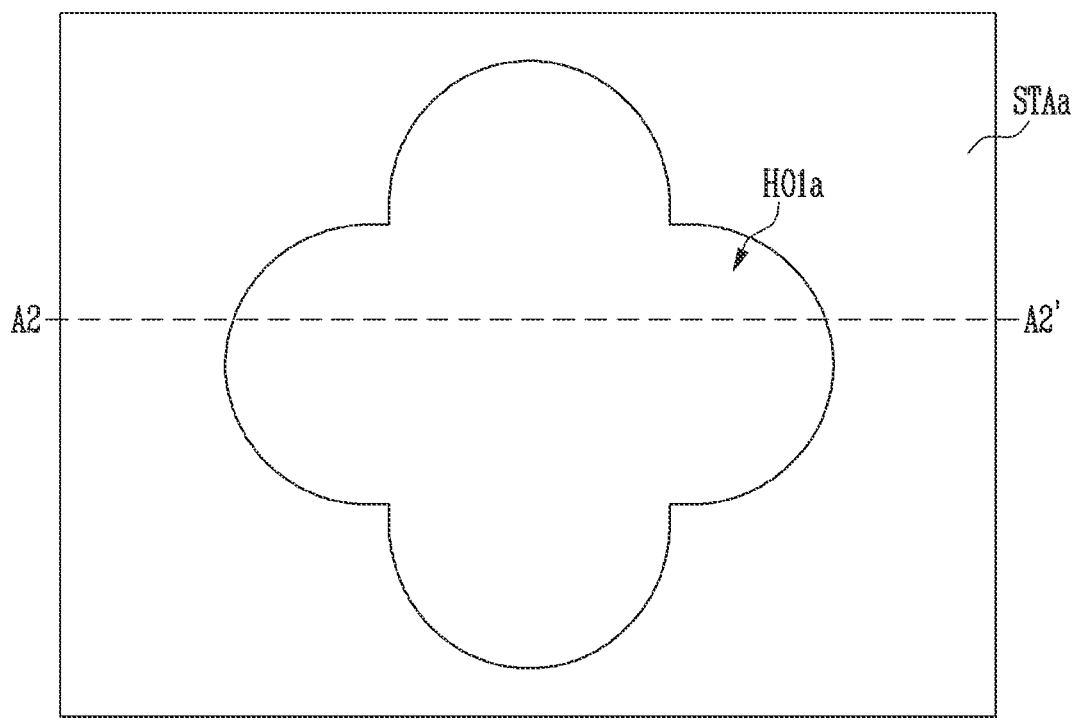
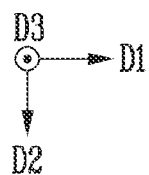

FIG. 4A
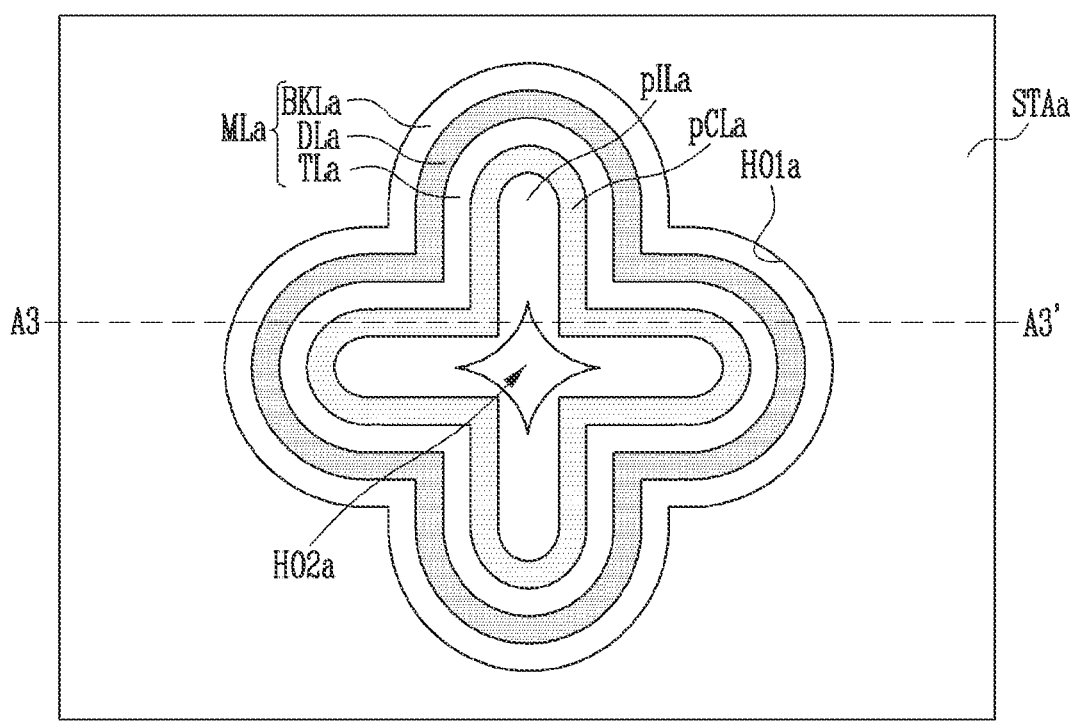
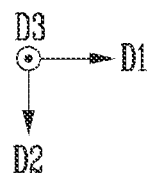

FIG. 6A
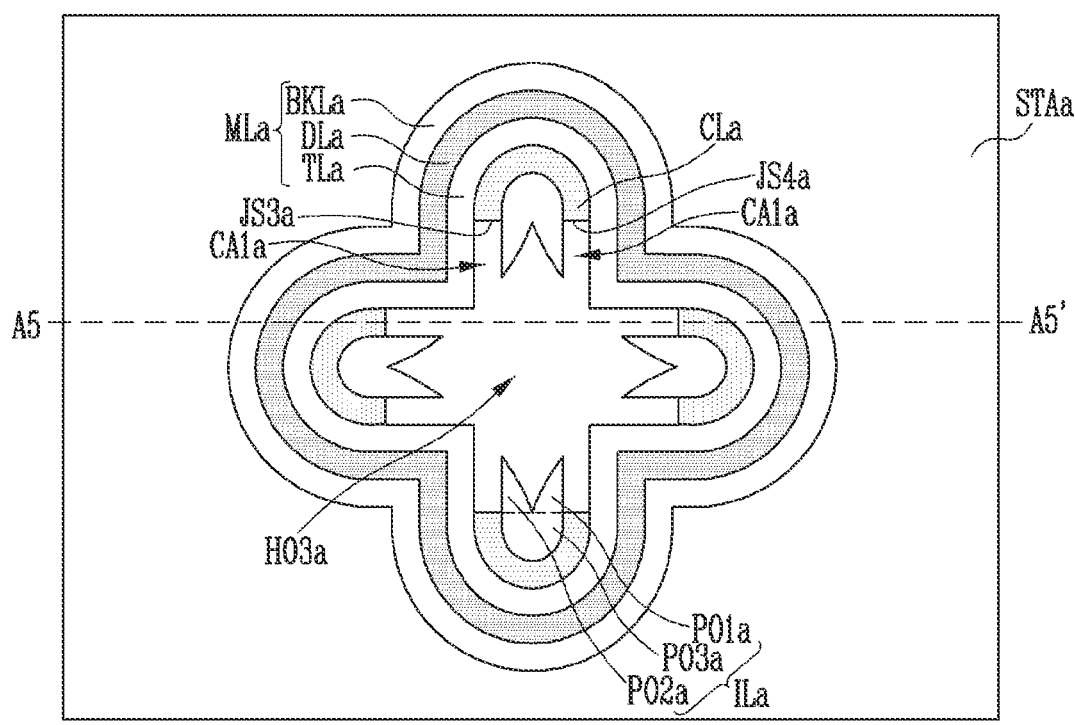
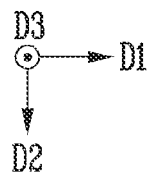

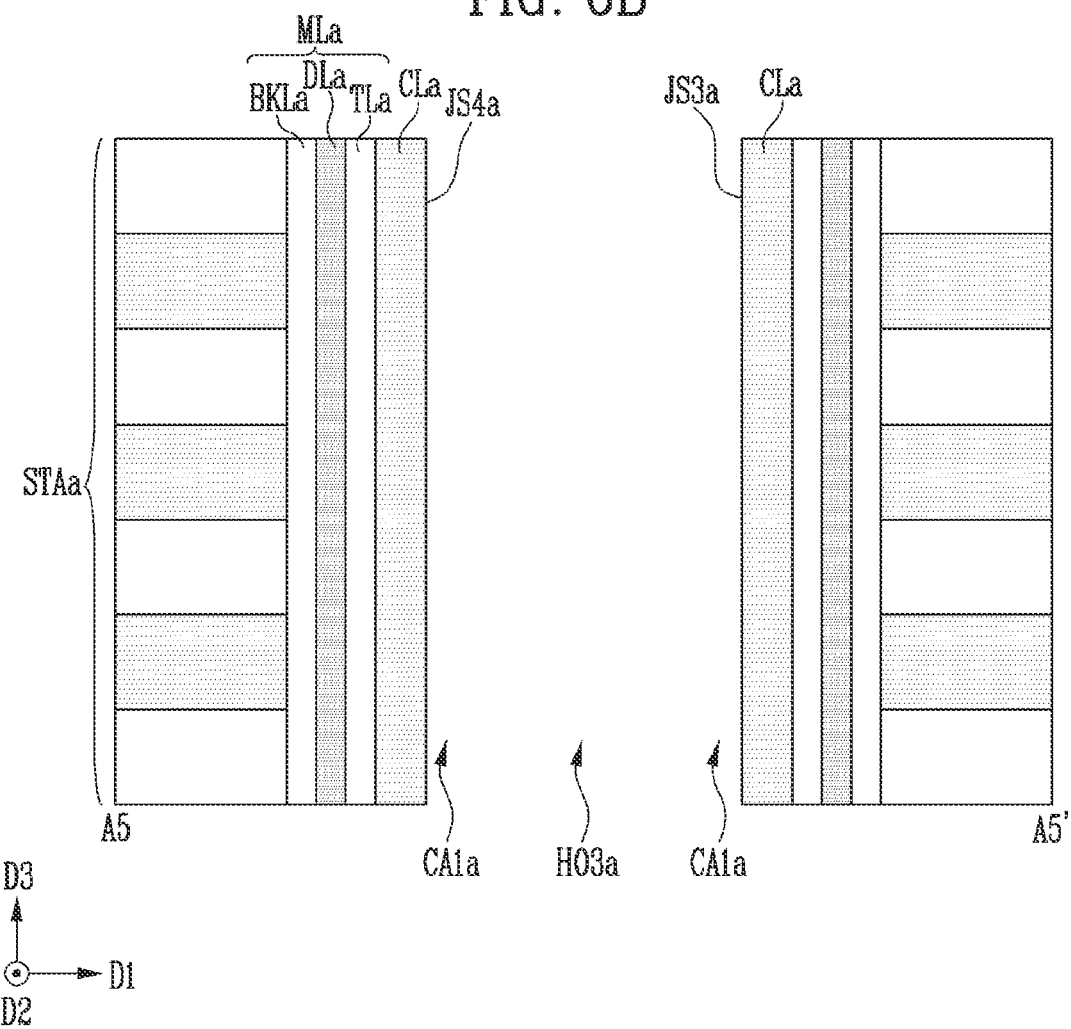

FIG. 10B
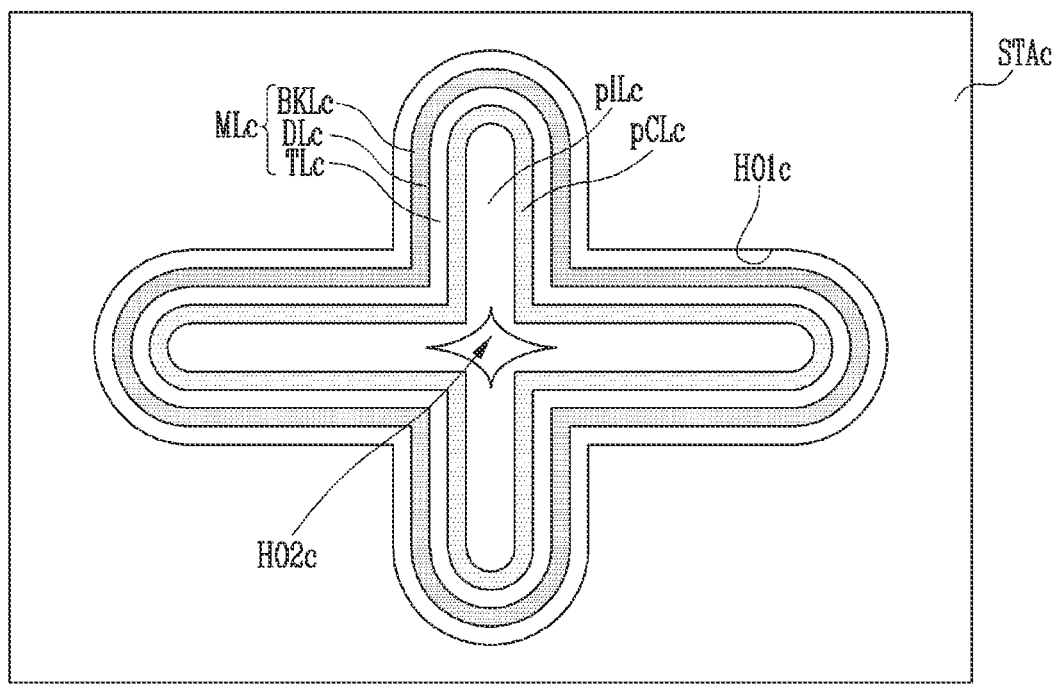
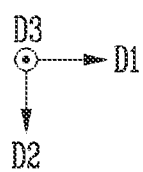

SEMICONDUCTOR DEVICE AND METHOD OF MANUFACTURING THE SEMICONDUCTOR DEVICE

CROSS-REFERENCE TO RELATED APPLICATION

The present application claims priority under 35 U.S.C. § 119(a) to Korean patent application number 10-2020-0126712 filed on Sep. 29, 2020, in the Korean intellectual Property Office, the entire disclosure of which is incorporated by reference herein.

BACKGROUND

1. Technical Field

Various embodiments of the present disclosure generally relate to a semiconductor device and a method of manufacturing the semiconductor device, and more particularly to a three-dimensional (3D) semiconductor device and a method of manufacturing the 3D semiconductor device.

2. Related Art

A semiconductor memory device includes memory cells which may store data. A three-dimensional (3D) semiconductor memory device includes memory cells arranged in three dimensions, thus reducing an area occupied by memory cells per unit area of a substrate.

In order to improve a degree of integration of a 3D semiconductor memory device, the number of stacks of memory cells may be increased. As the number of stacks of memory cells is increased, the reliability of operation of the 3D semiconductor memory device may be deteriorated.

SUMMARY

An embodiment of the present disclosure may provide for a semiconductor device. The semiconductor device may include a stacked body including conductive patterns and insulating patterns that are alternately stacked, a filling layer configured to pass through the stacked body, a first channel layer configured to pass through the stacked body and coupled to the filling layer, a second channel layer configured to pass through the stacked body and coupled to the filling layer, a first interposed layer configured to pass through the stacked body and disposed between the first channel layer and the filling layer, a second interposed layer configured to pass through the stacked body and disposed between the second channel layer and the filling layer, and a memory layer configured to surround the filling layer, the first and second channel layers, and the first and second interposed layers.

An embodiment of the present disclosure may provide for a semiconductor device. The semiconductor device may include a stacked body including conductive patterns and insulating patterns that are alternately stacked, a filling layer configured to pass through the stacked body, a first channel layer configured to pass through the stacked body and coupled to the filling layer, a second channel layer configured to pass through the stacked body and coupled to the filling layer, and a memory layer configured to surround the filling layer, the first channel layer, and the second channel layer, wherein the first channel layer includes a first junction surface and a second junction surface that both contact with the filling layer, and wherein the first junction surface and the second junction surface are spaced apart from each other.

An embodiment of the present disclosure may provide for a semiconductor device. The semiconductor device may include a stacked body including conductive patterns and insulating patterns that are alternately stacked, a filling layer configured to pass through the stacked body, a first channel layer configured to pass through the stacked body and coupled to the filling layer, a second channel layer configured to pass through the stacked body and coupled to the filling layer, and a memory layer configured to surround the filling layer, the first channel layer, and the second channel layer, wherein the filling layer includes a first protrusion and a second protrusion that both contact with the first channel layer, wherein the first protrusion includes a first outside wall in contact with the memory layer and a first junction surface in contact with the first channel layer, wherein the second protrusion includes a second outside wall coming into contact with the memory layer and a second junction surface coming into contact with the first channel layer, and wherein the first outside wall and the second outside wall are substantially parallel to each other.

An embodiment of the present disclosure may provide for a method of manufacturing a semiconductor device. The method may include forming a stacked body, forming a first hole configured to pass through the stacked body, sequentially forming a memory layer, a preliminary channel layer, and a preliminary interposed layer in the first hole, separating the preliminary interposed layer into a plurality of interposed layers by etching the preliminary interposed layer, separating the preliminary channel layer into a plurality of channel layers, and forming a filling layer coupled to the interposed layers and the channel layers.

BRIEF DESCRIPTION OF THE DRAWINGS

FIG. 1 is a diagram illustrating a memory cell array of a semiconductor device according to an embodiment of the present disclosure.

FIG. 2B is a sectional view taken along line A1-A1' of FIG. 2A.

FIGS. 3A, 4A, 5A, and 6A are plan views for explaining a method of manufacturing the semiconductor device in FIGS. 2A to 2D.

FIG. 6B is a sectional view taken along line A5-A5' of FIG. 6A.

FIGS. 10A, 10B, 10C, and 10D are plan views for explaining a method of manufacturing the semiconductor device of FIG. 9.

DETAILED DESCRIPTION

Figure 2A:
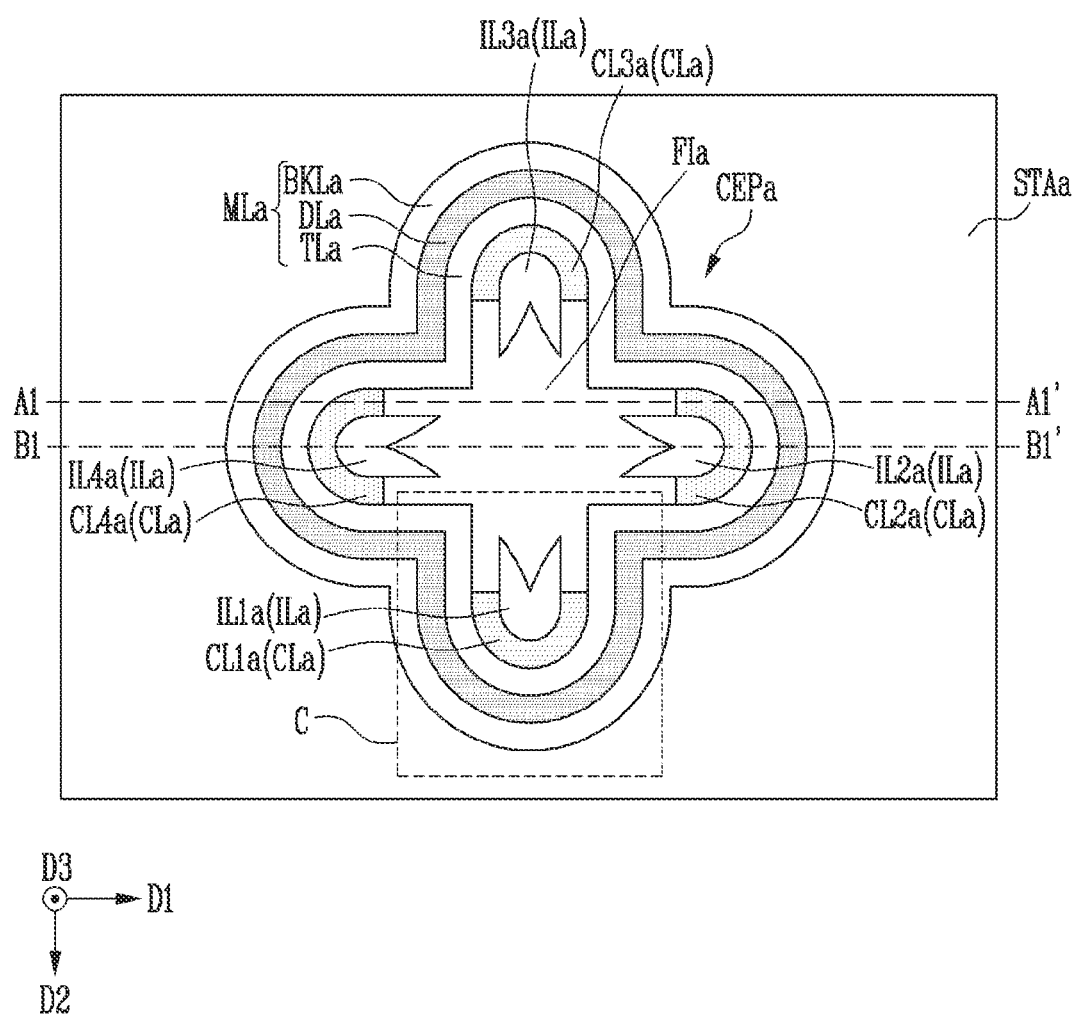
FIG. 2A is a plan view of a semiconductor device according to an embodiment of the present disclosure.

The technical spirit of the present disclosure may be implemented using embodiments to which various modifications may be applied and which have various aspects. Hereinafter, the present disclosure will be described with reference to some embodiments so that those skilled in the art to which the present disclosure pertains can easily practice the present disclosure.

Various embodiments of the present disclosure may be directed to a semiconductor device having an improved degree of integration.

FIG. 1 is a diagram illustrating a memory cell array of a semiconductor device according to an embodiment of the present disclosure.

Referring to FIG. 1, the memory cell array of the semiconductor device may include a plurality of strings ST coupled to a source line SL and a bit line BL.

Each string ST may include a source select transistor SST, a plurality of memory cells MC, and a drain select transistor DST which are coupled in series to each other between the source line SL and the bit line BL. In an embodiment, the number of source select transistors SST included in one string ST may be two or more. In an embodiment, the number of drain select transistors DST included in one string ST may be two or more. The number of memory cells MC included in one string ST is not limited to that illustrated in the drawing.

The source select transistor SST may be coupled to the source line SL, and the drain select transistor DST may be coupled to the bit line BL. The memory cells MC may be coupled in series between the source select transistor SST and the drain select transistor DST.

The source select transistor SST may be coupled to a source select line SSL. The drain select transistor DST may be coupled to a drain select line DSL. The memory cells MC may be coupled to word lines WL, respectively. Depending on the operation of the semiconductor device, data may be stored in each memory cell MC.

Figure 2C:
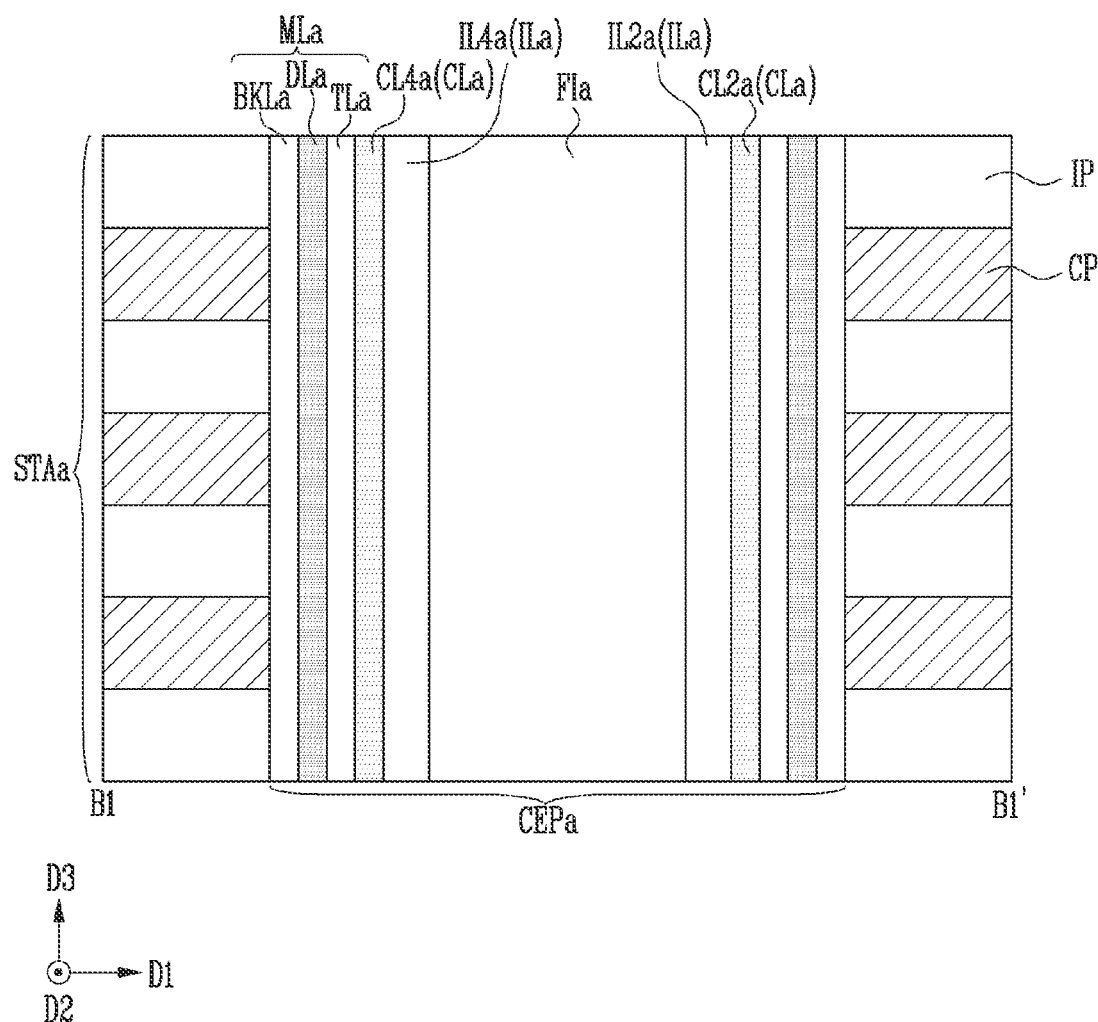
FIG. 2C is a sectional view taken along line B1-B1' of FIG. 2A.
Figure 2D:
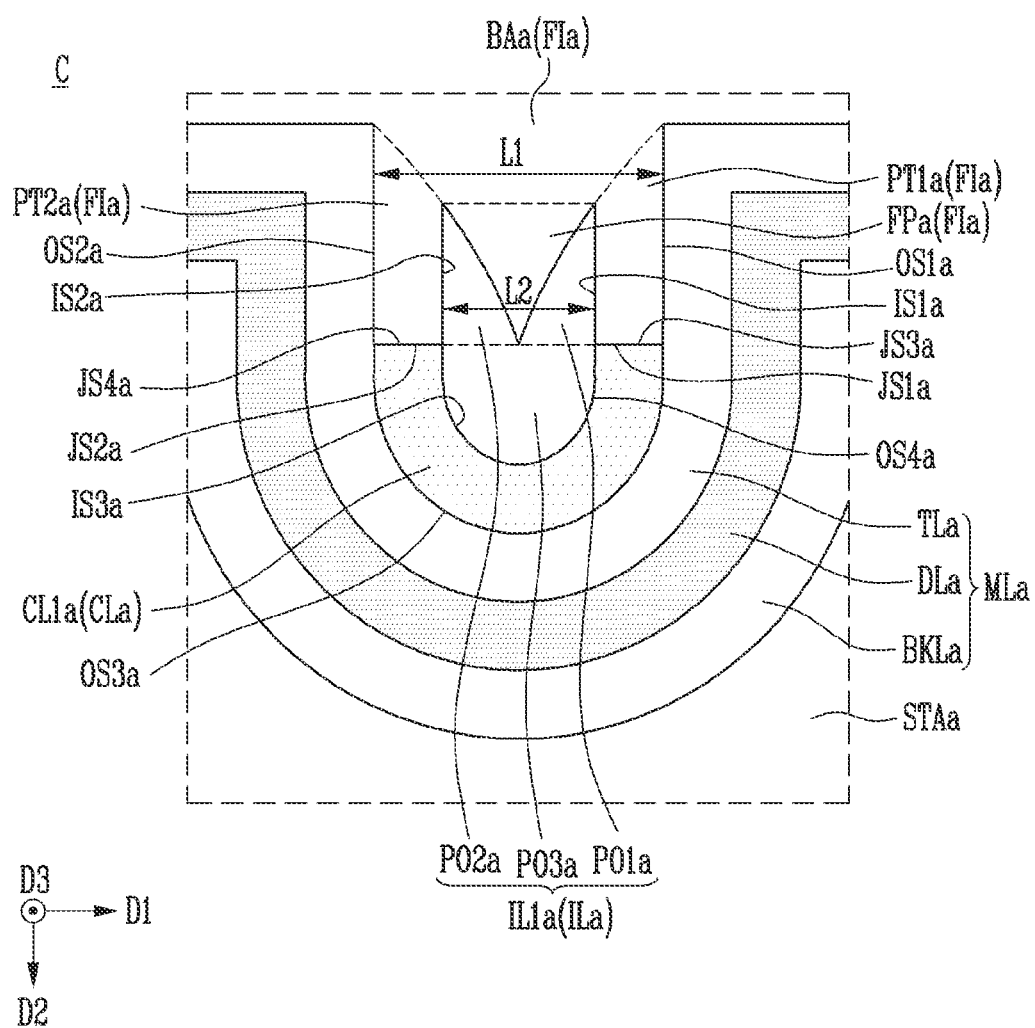
FIG. 2D is an enlarged view of area C of FIG. 2A.

FIG. 2A is a plan view of a semiconductor device according to an embodiment of the present disclosure. FIG. 2B is a sectional view taken along line A1-A1' of FIG. 2A. FIG. 2C is a sectional view taken along line B1-B1' of FIG. 2A. FIG. 2D is an enlarged view of area C of FIG. 2A.

Referring to FIGS. 2A to 2C, the semiconductor device may include a stacked body STAa including insulating patterns IP and conductive patterns CP.

The stacked body STAa may be formed on a substrate (not illustrated). The substrate may physically hold the stacked body STAa. In an example, the substrate may be a semiconductor substrate. The substrate may have the shape of a plate extending along a plane defined by a first direction D1 and a second direction D2. The first direction D1 and the second direction D2 may intersect each other. For example, the first direction D1 and the second direction D2 may be orthogonal to each other.

In an embodiment, a peripheral circuit structure (not illustrated) may be provided between the stacked body STAa and the substrate. The peripheral circuit structure may include transistors and lines forming a peripheral circuit of the semiconductor device.

A source structure (not illustrated) may be provided between the stacked body STAa and the substrate. The source structure may be used as a source line of the semiconductor device. The source structure may include a conductive material. In an example, the source structure may include a doped polysilicon. The source structure may have the shape of a plate extending along a plane defined by the first direction D1 and the second direction D2.

The conductive patterns CP and the insulating patterns IP of the stacked body STAa may be alternately stacked one on top of another. For example, the conductive patterns CP and the insulating patterns IP of the stacked body STAa may be alternately arranged in a third direction D3. The third direction D3 may intersect the first direction D1 and the second direction D2. For example, the third direction D3 may be orthogonal to the first direction D1 and the second direction D2.

The insulating patterns IP may include an insulating material. For example, the insulating patterns IP may include oxide. Each of the conductive patterns CP may include a gate conductive layer and a barrier layer. The barrier layer may enclose the surface of the gate conductive layer. For example, the gate conductive layer may include at least one of a doped semiconductor material, metal silicide, tungsten, nickel, and cobalt. For example, the barrier layer may include at least one of titanium nitride and tantalum nitride. Each conductive pattern CP may be used as a word line, a source select line or a drain select line of the semiconductor device. In an embodiment, the barrier layer may surround the surface of the gate conductive layer.

A cell plug CEPa passing through the stacked body STAa may be provided. The cell plug CEPa may extend in the third direction D3 and then pass through the stacked body STAa. The cell plug CEPa may be coupled to the source structure. The semiconductor device may include a plurality of cell plugs CEPa. Each cell plug CEPa may include a filling layer FIa, channel layers CLa, interposed layers ILa, and a memory layer MLa. The filling layer FIa, the channel layers CLa, the interposed layers ILa, and the memory layer MLa may extend in the third direction D3, and then pass through the stacked body STAa.

The filling layer FIa may be disposed at the center of the cell plug CEPa. The filling layer FIa may include an insulating material. For example, the filling layer FIa may include oxide.

The channel layers CLa may be coupled to the filling layer FIa. The channel layers CLa may come into contact with the filling layer FIa. The channel layers CLa may be spaced apart from each other by the filling layer FIa. Each of the channel layers CLa may be curved. For example, from the standpoint of a plane in FIG. 2A, each channel layer CLa may have the shape of a circular arc. Each of the channel layers CLa may be electrically coupled to the source structure. The channel layers CLa may include a semiconductor material. For example, the channel layers CLa may include polysilicon.

The channel layers CLa may include first to fourth channel layers CL1a, CL2a, CL3a, and CL4a. The number of channel layers CLa is not limited to that illustrated in the drawings. For example, the number of channel layers CLa may be three or less, or may be five or more.

The interposed layers ILa may be coupled to the filling layer FIa. The interposed layers ILa may come into contact with the filling layer FIa. The interposed layers ILa may be spaced apart from each other by the filling layer FIa. Each of the interposed layers ILa may be disposed between the corresponding channel layer CLa and the filling layer FIa. Each of the interposed layers ILa may be enclosed with the corresponding channel layer CLa and the filling layer FIa. In an embodiment, each interposed layer ILa may include a material having etch selectivity for the corresponding channel layer CLa. For example, the interposed layer ILa may include oxide or nitride. In an embodiment, the interposed layer ILa may include an insulating material different from that of the filling layer FIa. For example, the interposed layer ILa may include nitride, and the filling layer FIa may include oxide. In an embodiment, each of the interposed layers ILa may be surrounded with the corresponding channel layer CLa and the filling layer FIa.

The interposed layers ILa may include first to fourth interposed layers IL1a, IL2a, IL3a, and IL4a. The first interposed layer IL1a may be coupled to the first channel layer CL1a. The first interposed layer IL1a may be disposed between the first channel layer CL1a and the filling layer FIa. The second interposed layer IL2a may be coupled to the second channel layer CL2a. The second interposed layer IL2a may be disposed between the second channel layer CL2a and the filling layer FIa. The third interposed layer IL3a may be coupled to the third channel layer CL3a. The third interposed layer IL3a may be disposed between the third channel layer CL3a and the filling layer FIa. The fourth interposed layer IL4a may be coupled to the fourth channel layer CL4a. The fourth interposed layer IL4a may be disposed between the fourth channel layer CL4a and the filling layer FIa. The number of interposed layers ILa is not limited to that illustrated in the drawings. For example, the number of interposed layers ILa may be three or less, or may be five or more.

The memory layer MLa may enclose the filling layer FIa, the channel layers CLa, and the interposed layers ILa. The memory layer MLa may include a tunnel insulating layer TLa, a data storage layer DLa, and a blocking layer BKLa. In an embodiment, the memory layer MLa may surround the filling layer FIa, the channel layers CLa, and the interposed layers ILa.

The tunnel insulating layer TLa may enclose the filling layer FIa, the channel layers CLa, and the interposed layers ILa. The tunnel insulating layer TLa may include a material enabling charge tunneling. For example, the tunnel insulating layer TLa may include oxide. In an embodiment, the tunnel insulating layer TLa may surround the filling layer FIa, the channel layers CLa, and the interposed layers Ila.

The data storage layer DLa may enclose the tunnel insulating layer TLa. In an embodiment, the data storage layer DLa may include a material in which charges can be trapped. In an example, the data storage layer DLa may include nitride. In an embodiment, the data storage layer DLa may include various types of materials depending on a data storage scheme. In an example, the data storage layer DLa may include silicon, phase-change material, or nanodots. In an embodiment, the data storage layer DLa may surround the tunnel insulating layer TLa.

The blocking layer BKLa may include material which can block the movement of charges. For example, the blocking layer BLKa may include oxide.

Bit lines (not illustrated) coupled to the cell plug CEPa may be provided. The bit lines may be electrically coupled to the channel layers CLa of the cell plug CEPa. The channel layers CLa of one cell plug CEPa may be coupled to different bit lines. For example, the first to fourth channel layers CL1a, CL2a, CL3a, and CL4a may be coupled to different bit lines. In an example, the first and second channel layers CL1a and CL2a may be coupled to one bit line, and the third and fourth channel layers CL3a and CL4a may be coupled to another bit line.

Referring to FIG. 2D, the filling layer FIa may include a base part BAa, first protrusions PT1a, second protrusions PT2a, and filling parts FPa. The base part BAa, the first protrusions PT1a, the second protrusions PT2a, and the filling parts FPa may extend in the third direction D3 and then pass through the stacked body STAa. The base part BAa may be a part arranged at the center of the filling layer FIa. The first protrusions PT1a, the second protrusions PT2a, and the filling parts FPa may be parts protruding from an outside wall of the base part BAa.

A pair of a first protrusion PT1a and a second protrusion PT2a may be coupled to one channel layer CLa. For example, a pair of a first protrusion PT1a and a second protrusion PT2a may be coupled to the first channel layer CL1a. A pair of a first protrusion PT1a and a second protrusion PT2a may come into contact with one channel layer CLa. For example, a pair of a first protrusion PT1a and a second protrusion PT2a may come into contact with the first channel layer CL1a. The corresponding interposed layer ILa may be disposed between the first protrusion PT1a and the second protrusion PT2a forming one pair. In an example, the first interposed layer IL1a may be disposed between the first protrusion PT1a and the second protrusion PT2a forming one pair, which are coupled to the first channel layer CL1a.

The first protrusion PT1a may include a first outside wall OS1a, a first inside wall IS1a, and a first junction surface JS1a. The first outside wall OS1a, the first inside wall IS1a, and the first junction surface JS1a of the first protrusion PT1a may be even. The first outside wall OS1a may come into contact with the tunnel insulating layer TLa of the memory layer MLa. The first inside wall IS1a may come into contact with the interposed layer ILa. In an example, the first inside wall IS1a of the first protrusion PT1a coming into contact with the first channel layer CL1a may come into contact with the first interposed layer IL1a. The first junction surface JS1a may come into contact with the channel layer CLa. For example, the first junction surface JS1a of the first protrusion PT1a coming into contact with the first channel layer CL1a may come into contact with the first channel layer CL1a.

The first outside wall OS1a and the first inside wall IS1a of the first protrusion PT1a may be parallel to each other. The first outside wall OS1a and the first junction surface JS1a of the first protrusion PT1a may intersect each other. For example, the first outside wall OS1a and the first junction surface JS1a of the first protrusion PT1a may be orthogonal to each other. The first inside wall IS1a and the first junction surface JS1a of the first protrusion PT1a may intersect each other. For example, the first inside wall IS1a and the first junction surface JS1a of the first protrusion PT1a may be orthogonal to each other.

For example, the first outside wall OS1a and the first inside wall IS1a of the first protrusion PT1a coupled to the first channel layer CL1a may be parallel to the second direction D2. For example, the first junction surface JS1a of the first protrusion PT1a coupled to the first channel layer CL1a may be parallel to the first direction D1.

The second protrusion PT2a may include a second outside wall OS2a, a second inside wall IS2a, and a second junction surface JS2a. The second outside wall OS2a, the second inside wall IS2a, and the second junction surface JS2 of the second protrusion PT2a may be even. The second outside wall OS2a may come into contact with the tunnel insulating layer TLa of the memory layer MLa. The second inside wall IS2a may come into contact with the interposed layer ILa. For example, the second inside wall IS2a of the second protrusion PT2a coming into contact with the first channel layer CL1a may come into contact with the first interposed layer IL1a. The second junction surface JS2a may come into contact with the channel layer CLa. For example, the second junction surface JS2a of the second protrusion PT2a coming into contact with the first channel layer CL1a may come into contact with the first channel layer CL1a.

The second outside wall IS2a and the second inside wall IS2a of the second protrusion PT2a may be parallel to each other. The second outside wall OS2a and the second junction surface JS2a of the second protrusion PT2a may intersect each other. For example, the second outside wall OS2a and the second junction surface JS2a of the second protrusion PT2a may be orthogonal to each other. The second inside wall OS2a and the second junction surface JS2a of the second protrusion PT2a may intersect each other. For example, the second inside wall IS2a and the second junction surface JS2a of the second protrusion PT2a may be orthogonal to each other.

For example, the second outside wall OS2a and the second inside wall IS2a of the second protrusion PT2a coupled to the first channel layer CL1a may be parallel to the second direction D2. For example, the second junction surface JS2a of the second protrusion PT2a coupled to the first channel layer CL1a may be parallel to the first direction D1.

The first outside wall OS1a, the first inside wall IS1a, the second outside wall OS2a, and the second inside wall IS2a may be parallel to each other. The shortest distance between the first outside wall OS1a of the first protrusion PT1a and the second outside wall OS2a of the second protrusion PT2a may be defined as a first distance L1. For example, the first distance L1 may be the shortest distance between the first outside wall OS1a of the first protrusion PT1a and the second outside wall OS2a of the second protrusion PT2a in the first direction D1. The first distance L1 may be uniform.

The shortest distance between the first inside wall IS1a of the first protrusion PT1a and the second inside wall IS2a of the second protrusion PT2a may be defined as a second distance L2. For example, the second distance L2 may be the shortest distance between the first inside wall IS1a of the first protrusion PT1a and the second inside wall IS2a of the second protrusion PT2a in the first direction D1. The second distance L2 may be uniform.

The first junction surface JS1a of the first protrusion PT1a and the second junction surface JS2a of the second protrusion PT2a may be parallel to each other. The first junction surface JS1a of the first protrusion PT1a and the second junction surface JS2a of the second protrusion PT2a may be spaced apart from each other. The shortest distance between the first junction surface JS1a of the first protrusion PT1a and the second junction surface JS2a of the second protrusion PT2a may be identical to the second distance L2.

The filling part FPa may be disposed between the first protrusion PT1a and the second protrusion PT2a forming one pair. The first protrusion PT1a and the second protrusion PT2a forming one pair may be spaced apart from each other with the filling part FPa interposed therebetween. The maximum width of the filling part FPa may be identical to the second distance L2. For example, the maximum width of the filling part FPa, coupled to the first interposed layer IL1a, in the first direction D1 may be identical to the second distance L2. The width of the filling part FPa may be smaller in a direction closer to the channel layer CLa. For example, the width of the filling part FPa, coupled to the first interposed layer IL1a, in the first direction D1 may be smaller in a direction closer to the first channel layer CL1a.

The channel layer CLa may include a third outside wall OS3a, a third inside wall IS3a, a third junction surface JS3a, and a fourth junction surface JS4a. The third outside wall OS3a of the channel layer CLa may come into contact with the tunnel insulating layer TLa of the memory layer MLa. The third outside wall OS3a of the channel layer CLa may be curved. For example, from the standpoint of a section of FIG. 2D, the third outside wall OS3a of the channel layer CLa may have the shape of a circular arc. The third inside wall IS3a of the channel layer CLa may come into contact with the first interposed layer IL1a. The third inside wall IS3a of the channel layer CLa may be curved. For example, from the standpoint of the section of FIG. 2D, the third inside wall IS3a of the channel layer CLa may have the shape of a circular arc. The third inside wall IS3a of the channel layer CLa may be spaced apart from the third outside wall OS3a of the channel layer CLa.

The third junction surface JS3a of the channel layer CLa may come into contact with the first protrusion PT1a of the filling layer Fla. The third junction surface JS3a of the channel layer CLa may come into contact with the first junction surface JS1 of the first protrusion PT1a of the filling layer Fla. The fourth junction surface JS4a of the channel layer CLa may come into contact with the second protrusion PT2a of the filling layer Fla. The fourth junction surface JS4a of the channel layer CLa may come into contact with the second junction surface JS2a of the second protrusion PT2a of the filling layer Fla. The third junction surface JS3a of the channel layer CLa may couple the third inside wall IS3a and the third outside wall OS3a of the channel layer CLa to each other. The fourth junction surface JS4a of the channel layer CLa may couple the third inside wall IS3a and the third outside wall OS3a of the channel layer CLa to each other.

The third junction surface JS3a and the fourth junction surface JS4a of the channel layer CLa may be even. The third junction surface JS3a and the fourth junction surface JS4a of the channel layer CLa may be parallel to each other. The third junction surface JS3a and the fourth junction surface JS4a of the channel layer CLa may be spaced apart from each other. The shortest distance between the third junction surface JS3a and the fourth junction surface JS4a of the channel layer CLa may be equal to the second distance L2. The interposed layer ILa may be disposed between third junction surface JS3a and the fourth junction surface JS4a of the channel layer CLa.

The third junction surface JS3a and the fourth junction surface JS4a of the channel layer CLa may intersect the third outside wall OS3a of the channel layer CLa. The third junction surface JS3a and the fourth junction surface JS4a of the channel layer CLa may intersect the third inside wall IS3a of the channel layer CLa.

The interposed layer ILa may include a first portion PO1a, a second portion PO2a, and a third portion PO3a.

The first portion PO1a of the interposed layer ILa may be a portion disposed between the first protrusion PT1a and the filling part FPa of the filling layer FIa. The first portion PO1a of the interposed layer ILa may be coupled to the first protrusion PT1a and the filling part FPa of the filling layer FIa. The first portion PO1a of the interposed layer ILa may come into contact with the first protrusion PT1a and the filling part FPa of the filling layer FIa. The width of the first portion PO1a of the interposed layer ILa may be greater in a direction closer to an adjacent channel layer CLa. For example, the width of the first portion PO1a of the first interposed layer IL1a in the first direction D1 may be greater in a direction closer to the first channel layer CL1a.

The second portion PO2a of the interposed layer ILa may be a portion disposed between the second protrusion PT2a and the filling part FPa of the filling layer FIa. The second portion PO2a of the interposed layer ILa may be coupled to the second protrusion PT2a and the filling part FPa of the filling layer FIa. The second portion PO2a of the interposed layer ILa may come into contact with the second protrusion PT2a and the filling part FPa of the filling layer FIa. The width of the second portion PO2a of the interposed layer ILa may be greater in a direction closer to an adjacent channel layer CLa. For example, the width of the second portion PO2a of the first interposed layer IL1a in the first direction D1 may be greater in a direction closer to the first channel layer CL1a.

The first and second portions PO1a and PO2a of the interposed layer ILa may be disposed between the first and second protrusions PT1a and PT2a of the filling layer FIa. The filling part FPa of the filling layer FIa may be disposed between the first and second portions PO1a and PO2a of the interposed layer ILa.

The third portion PO3a of the interposed layer ILa may be a portion which couples the first portion PO1a and the second portion PO2a of the interposed layer ILa to each other. The third portion PO3a of the interposed layer ILa may be a portion adjacent to the channel layer CLa. The third portion PO3a of the interposed layer ILa may be coupled to the channel layer CLa. The third portion PO3a of the interposed layer ILa may come into contact with the channel layer CLa. An outside wall of the third portion PO3a of the interposed layer ILa may be defined as an outside wall OS4a. The fourth outside wall OS4a of the third portion PO3a of the interposed layer ILa may come into contact with the third inside wall IS3a of the channel layer CLa. The fourth outside wall OS4a of the third portion PO3a of the interposed layer ILa may be curved in accordance with the third inside wall IS3a of the channel layer CLa. The width of the third portion PO3a of the interposed layer ILa may be smaller in a direction farther away from the first portion PO1a and the second portion PO2a of the interposed layer ILa. For example, the width of the third portion PO3a of the interposed layer ILa in the first direction D1 may be smaller in a direction farther away from the first portion PO1a and the second portion PO2a of the interposed layer ILa.

The semiconductor device according to an embodiment of the present disclosure may be configured such that one memory layer MLa encloses a plurality of channel layers CLa, and thus one cell plug CEPa may include a plurality of channel layers CLa. Accordingly, a plurality of strings may be configured using one cell plug CEPa. In an embodiment, the semiconductor device according to an embodiment of the present disclosure may be configured such that one memory layer MLa surrounds a plurality of channel layers CLa, and thus one cell plug CEPa may include a plurality of channel layers CLa.

Because the plurality of strings are configured using one cell plug CEPa, the degree of integration of the semiconductor device may be improved, and manufacture efficiency per unit area may be increased.

The semiconductor device according to an embodiment of the present disclosure may be configured such that one cell plug CEPa includes a plurality of channel layers CLa, and thus the planar area of the cell plug CEPa may be relatively large. Since the planar area of the cell plug CEPa is relatively large, the cell plug CEPa may be relatively easily manufactured, and thus the number of stacks of the stacked body STAa may be increased.

FIGS. 3A, 4A, 5A, and 6A are plan views for explaining a method of manufacturing the semiconductor device in FIGS. 2A to 2D. FIG. 3B is a sectional view taken along line A2-A2' of FIG. 3A. FIG. 4B is a sectional view taken along line A3-A3' of FIG. 4A. FIG. 5B is a sectional view taken along line A4-A4" of FIG. 5A. FIG. 6B is a sectional view taken along line A5-A5' of FIG. 6A.

For simplicity of description, the same reference numerals are used to designate the components described with reference to FIGS. 2A to 2D, and repeated descriptions thereof will be omitted.

A manufacturing method, which will be described below, is one embodiment of a method of manufacturing the semiconductor device of FIGS. 2A to 2D, and the method of manufacturing the semiconductor device of FIGS. 2A to 2D is not limited to the manufacturing method, which will be described below.

Figure 3B:
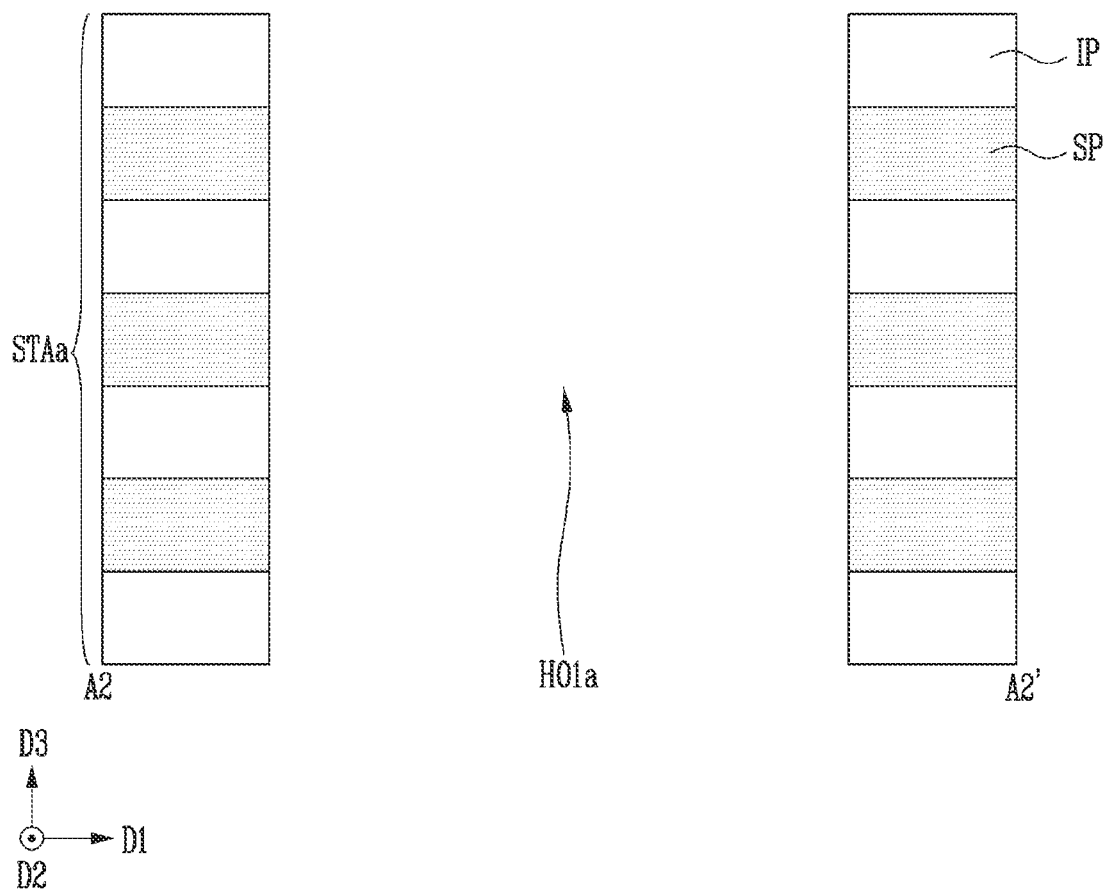
FIG. 3B is a sectional view taken along line A2-A2' of FIG. 3A.

Referring to FIGS. 3A and 3B, a stacked body STAa may be formed. The stacked body STAa may be formed such that stacked sacrificial layers and stacked insulating layers are alternately stacked in a third direction D3.

Next, a first hole HO1a passing through the stacked body STAa may be formed. The first hole HO1a may extend in the third direction D3 and then pass through the stacked body STAa. The first hole HO1a may be formed by etching the stacked sacrificial layers and the stacked insulating layers that have been alternately stacked. From the standpoint of a plane in FIG. 3A, the first hole HO1a may have the shape of a cross.

As the first hole HO1a is formed, the etched stacked sacrificial layers may be defined as sacrificial patterns SP, and the etched stacked insulating layers may be defined as insulating patterns IP.

Figure 4B:
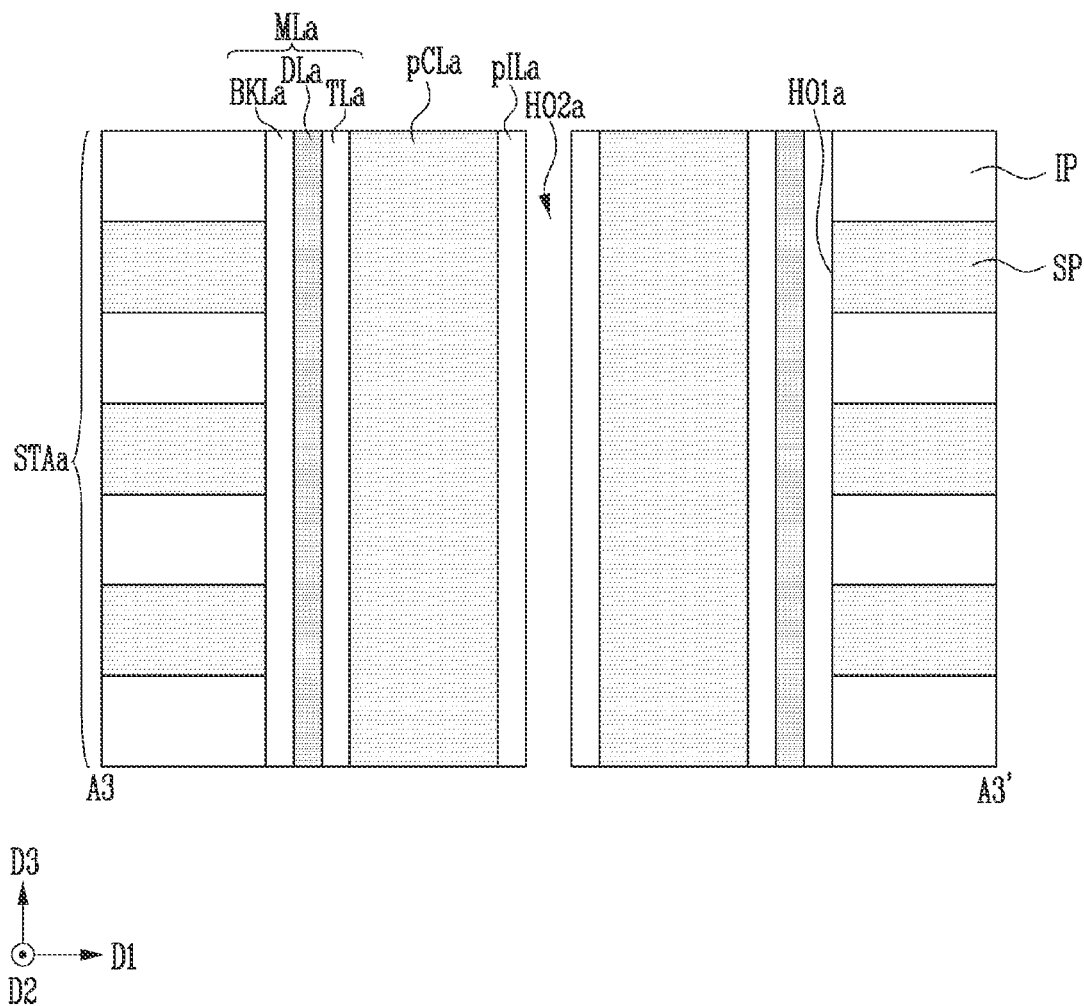
FIG. 4B is a sectional view taken along line A3-A3' of FIG. 4A.

Referring to FIGS. 4A and 4B, a memory layer MLa, a preliminary channel layer pCLa, and a preliminary interposed layer pILa may be formed in the first hole HO1a. Forming the memory layer MLa may include sequentially forming a blocking layer BKLa, a data storage layer DLa, and a tunnel insulating layer TLa in the first hole HO1a. After the memory layer MLa has been formed, the preliminary channel layer pCLa covering the memory layer MLa and the preliminary interposed layer pILa covering the preliminary channel layer pCLa may be sequentially formed.

The blocking layer BKLa, the data storage layer DLa, and the tunnel insulating layer TLa of the memory layer MLa, the preliminary channel layer pCLa, and the preliminary interposed layer pILa may be conformally formed in the first hole HO1a. Accordingly, the first hole HO1a may not be completely filled with the blocking layer BKLa, the data storage layer DLa, and the tunnel insulating layer TLa of the memory layer MLa, the preliminary channel layer pCLa, and the preliminary interposed layer pILa. A part of the first hole HO1a that is not completely filled with the blocking layer BKLa, the data storage layer DLa, and the tunnel insulating layer TLa of the memory layer MLa, the preliminary channel layer pCLa, and the preliminary interposed layer pILa may be defined as a second hole HOL2a. The second hole HO2a may be defined by the preliminary interposed layer pILa. The second hole HO2a may be defined in the preliminary interposed layer pILa.

Figure 5A:
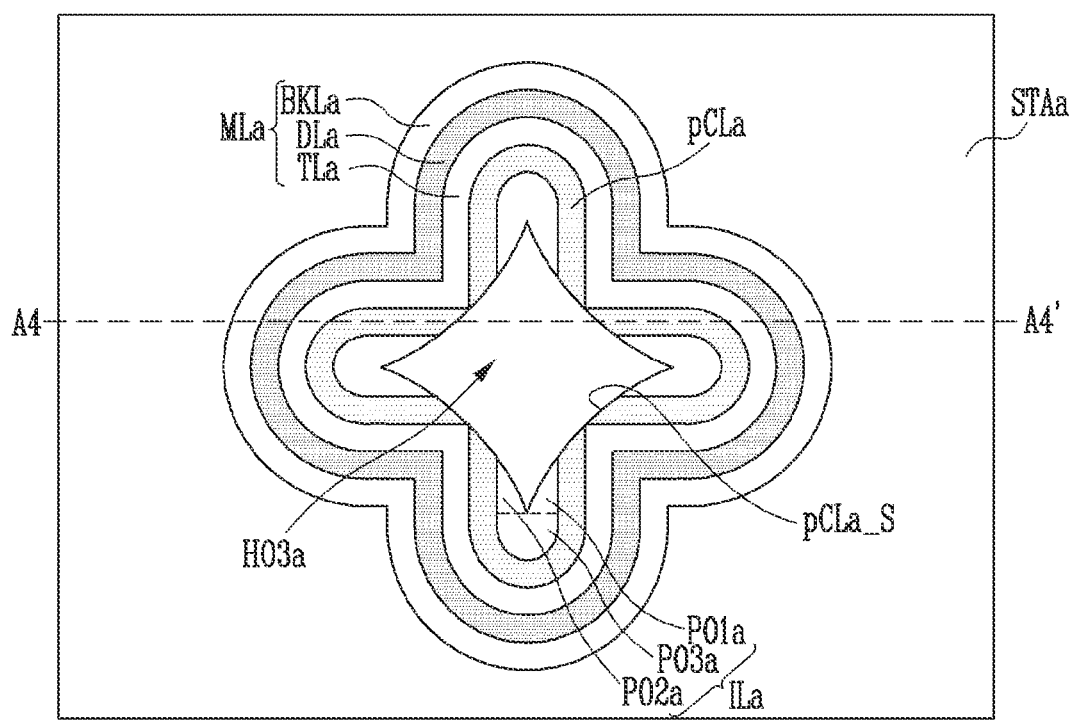
Figure 5B:
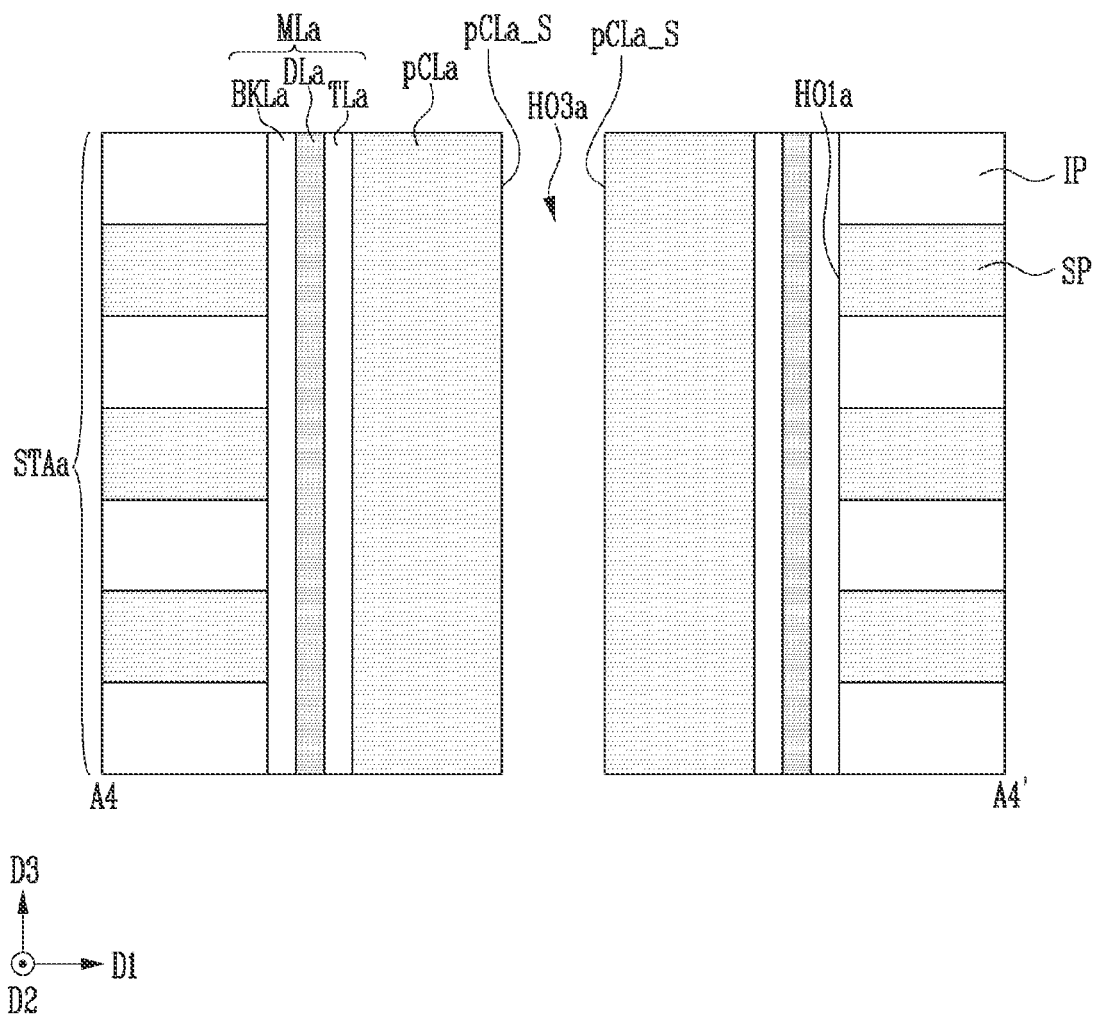
FIG. 5B is a sectional view taken along line A4-A4' of FIG. 5A.

Referring to FIGS. 5A and 5B, the second hole HO2a may be expanded. The expanded second hole HO2a may be defined as a third hole HO3a.

Expanding the second hole HO2a may include etching the preliminary interposed layer pILa and the preliminary channel layer pCLa. The preliminary interposed layer pILa may be etched, and may then be separated into a plurality of interposed layers ILa. A first portion PO1a and a second portion PO2a of each of the interposed layers ILa may be exposed by the third hole HO3a. Together with the etching of the preliminary interposed layer pILa, the preliminary channel layer pCLa may be exposed and etched. The etched preliminary channel layer pCLa may include sidewalls pCLa_S exposed through the third hole HO3a. The preliminary interposed layer pILa and the preliminary channel layer pCLa may be etched using a first etching material having a relatively high etching rate for the preliminary interposed layer pILa.

In an embodiment, at the step of expanding the second hole HO2a, the preliminary channel layer pCLa may be separated into a plurality of preliminary channel layers pCLa.

In an embodiment, unlike the configuration illustrated in the drawings, the expansion of the second hole HO2a may further include selectively etching the preliminary interposed layer pILa. In this case, the preliminary channel layer pCLa may not be etched when the second hole HO2a is expanded.

Referring to FIGS. 6A and 6B, the preliminary channel layer pCLa exposed through the third hole HO3a may be etched. The preliminary channel layer pCLa may be etched using a second etching material that enables the preliminary channel layer pCLa to be selectively etched. As the preliminary channel layer pCLa is etched, portions adjacent to the sidewalls pCLa_S of the preliminary channel layer pCLa may be removed. Empty spaces formed by removing the portions adjacent to the sidewalls pCLa_S of the preliminary channel layer pCLa may be defined by first cavities CA1a. The first cavities CA1a may be coupled to the third hole HO3a. The first cavities CA1a may be defined between the tunnel insulating layer TLa of the memory layer MLa and the interposed layer ILa.

The preliminary channel layer pCLa may be etched, and may then be separated into a plurality of channel layers CLa. The third junction surface JS3a and the fourth junction surface JS4a of the channel layer CLa may be exposed by the first cavities CA1a.

Then, the filling layer FIa may be formed in the third hole HO3a and the first cavities CA1a (see FIGS. 2A to 2D). In an example, the filling layer FIa may completely fill the third hole HO3a and the first cavities. Portions of the filling layer FIa filling the first cavities CA1a may be defined as first and second protrusions PT1a and PT2a (see FIGS. 2A to 2D).

Thereafter, the sacrificial patterns SP may be replaced with conductive patterns CP (see FIGS. 2A to 2D).

A method of manufacturing the semiconductor device according to an embodiment of the present disclosure may form a plurality of channel layers CLa using one first hole HO1a. Accordingly, the degree of integration of the semiconductor device may be improved, and manufacture efficiency per unit area may be increased.

The method of manufacturing the semiconductor device according to an embodiment of the present disclosure forms a plurality of channel layers CLa using one first hole HO1a, and thus the planar area of the first hole HO1a may be relatively large. Since the planar area of the first hole HO1a is relatively large, components in the first hole HO1a may be relatively easily manufactured, and the number of stacks of the stacked body STAa may be increased.

Figure 7:
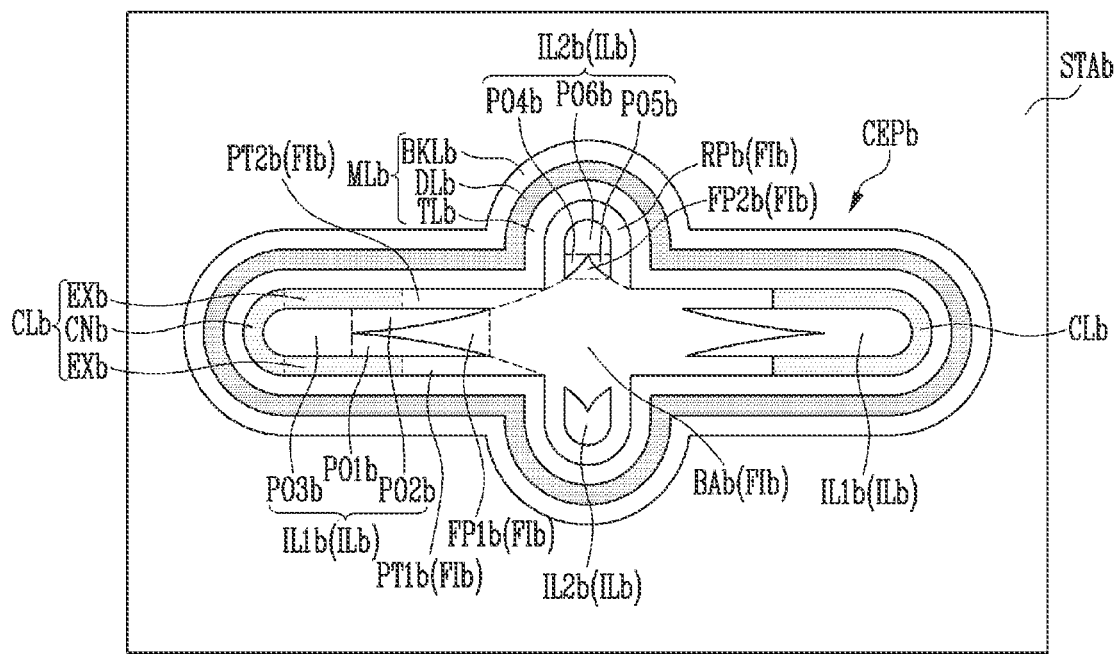
FIG. 7 is a plan view of a semiconductor device according to an embodiment of the present disclosure.

FIG. 7 is a plan view of a semiconductor device according to an embodiment of the present disclosure.

The semiconductor device according to FIG. 7 may be similar to that illustrated in FIGS. 2A to 2D except for a configuration to be described below.

Referring to FIG. 7, the semiconductor device may include a cell plug CEPb passing through a stacked body STAb. The cell plug CEPb may include a filling layer FIb, interposed layers ILb coupled to the filling layer FIb, channel layers CLb coupled to the filling layer FIb, and a memory layer MLb enclosing the filling layer FIb, the interposed layers ILb, and the channel layers CLb. The memory layer MLb may include a tunnel insulating layer TLb, a data storage layer DLb, and a blocking layer BKLb.

Each of the channel layers CLb may include extensions EXb which extend in a first direction D1 and a connector CNb which couples the extensions EXb to each other. The extensions EXb may be spaced apart from each other in a second direction D2. The connector CNb may be curved. For example, from the standpoint of a plane in FIG. 7, the connector CNb may have the shape of a circular arc.

The filling layer FIb may include a base part BAb, first and second protrusions PT1b and PT2b coupled to the base part BAb, and a first filling part FP1b coupled to the base part BAb. The first and second protrusions PT1b and PT2b may be parts coupled to the channel layer CLb, and the first filling part FP1b may be a part disposed between the first and second protrusions PT1b and PT2b.

The interposed layers ILb may include first interposed layers IL1b and second interposed layers IL2b. The first interposed layer IL1b may be coupled to the channel layer CLb. The first interposed layer ILb may be disposed between the extensions Exb of the channel layer CLb. The first interposed layer ILib may include a first portion PO1b between the first protrusion PT1b and the first filling part FP1b of the filling layer FIb, a second portion PO2b between the second protrusion PT2b and the first filling part FP1b of the filling layer FIb, and a third portion PO3b for coupling the first portion PO1b to the second portion PO2b.

The filling layer FIb may further include a round part RPb and a second protrusion FP2b coupled to the base part BAb. The round part RPb and the second protrusion FP2b may enclose the second interposed layer IL2b. The second protrusion FP2b may be disposed in the round part RPb. The second interposed layer IL2b may be disposed in the round part RPb. The first interposed layer IL1b may be enclosed with the channel layer CLb, the first and second protrusions PT1b and PT2b, and the first filling part FP1b. In an embodiment, the round part RPb and the second protrusion FP2b may surround the second interposed layer IL2b.

The second interposed layer IL2b may include a fourth portion PO4b and a fifth portion PO5b between the round part RPb and the second protrusion FP2b of the filling layer FIb and a sixth portion PO6b for coupling the fourth portion PO4b to the fifth portion PO5b. The second filling part FP2b may be disposed between the fourth and fifth portions PO4b and PO5b of the second interposed layer IL2b.

The maximum length of the first interposed layer IL1b may be greater than the maximum length of the second interposed layer IL2b, For example, the maximum length of the first interposed layer IL1b in the first direction D1 may be greater than the maximum length of the second interposed layer IL2b in the second direction D2.

The channel layers CLb may be spaced apart from each other. For example, the channel layers CLb may be spaced apart from each other in the first direction D1. The second interposed layers IL2b may be disposed between the channel layers CLb. The first interposed layers IL1bs may be spaced apart from each other. For example, the first interposed layers ILib may be spaced apart from each other in the first direction D1. The second interposed layers IL2b may be disposed between the first interposed layers ILib. The second interposed layers IL2b may be spaced apart from each other. For example, the second interposed layers IL2b may be spaced apart from each other in the second direction D2. The channel layers CLb and the first interposed layers ILib may be disposed between the second interposed layers IL2b.

FIGS. 8A, 8B, 8C, and 8D are plan views for explaining a method of manufacturing the semiconductor device of FIG. 7.

For simplicity of description, the same reference numerals are used to designate the components described with reference to FIG. 7, and repeated descriptions will be omitted.

A manufacturing method, which will be described below, is only one embodiment of a method of manufacturing the semiconductor device of FIG. 7, and the method of manufacturing the semiconductor device of FIG. 7 is not limited to the manufacturing method, which be described below.

Figure 8A:
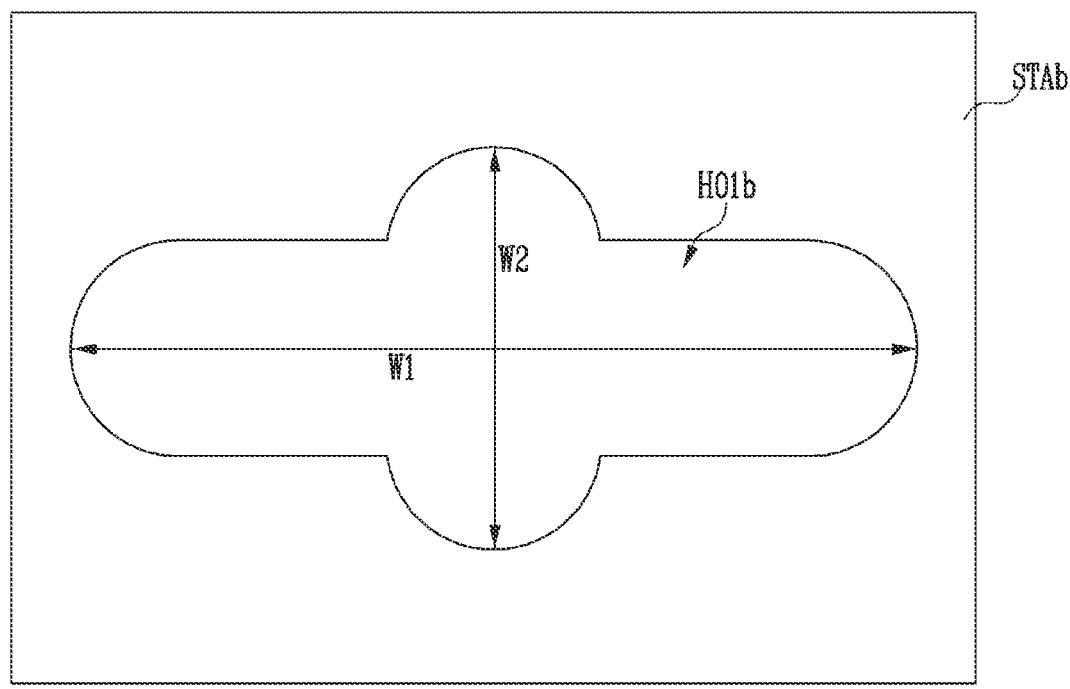
FIGS. 8A, 8B, 8C, and 8D are plan views for explaining a method of manufacturing the semiconductor device of FIG. 7.

Referring to FIG. 8A, a first hole HO1b passing through a stacked body STAb may be formed. From the standpoint of a plane in FIG. 8A, the first hole HO1b may have the shape of a cross. For example, the maximum width W1 of the first hole HO1b in the first direction D1 may be greater than the maximum width W2 thereof in the second direction D2.

Figure 8B:
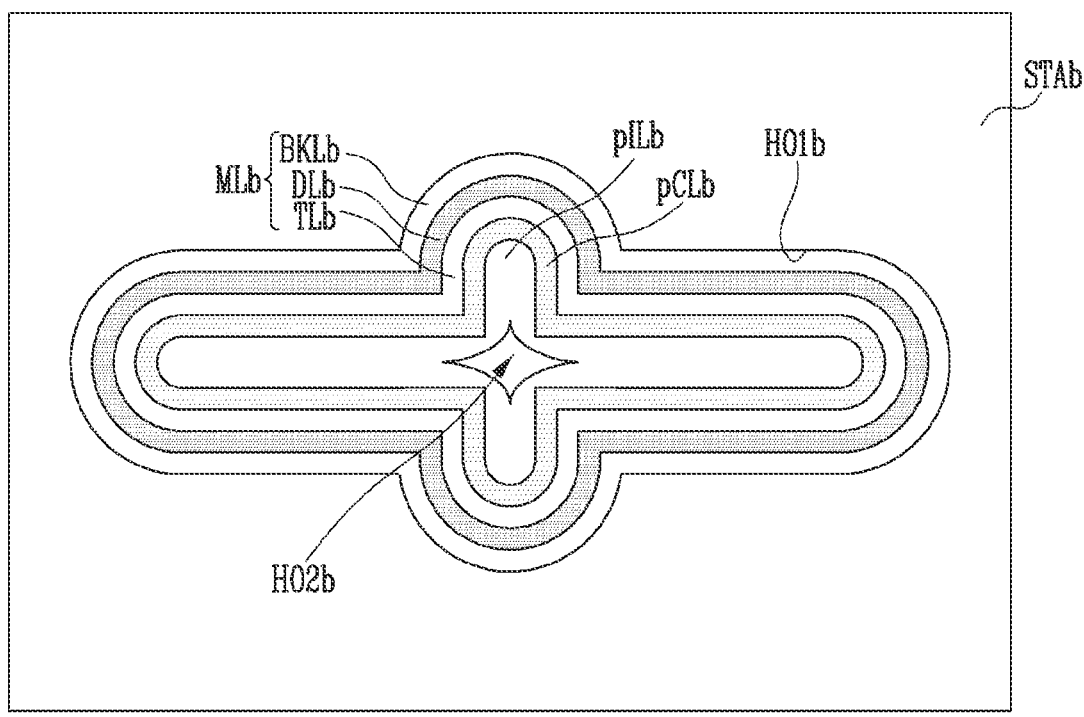

Referring to FIG. 8B, a memory layer MLb, a preliminary interposed layer pILb, and a preliminary channel layer pCLb may be formed in the first hole H01b. The memory layer MLb, the preliminary interposed layer pILb, and the preliminary channel layer pCLb may be formed, and thus a second hole HO2b may be defined.

Figure 8C:
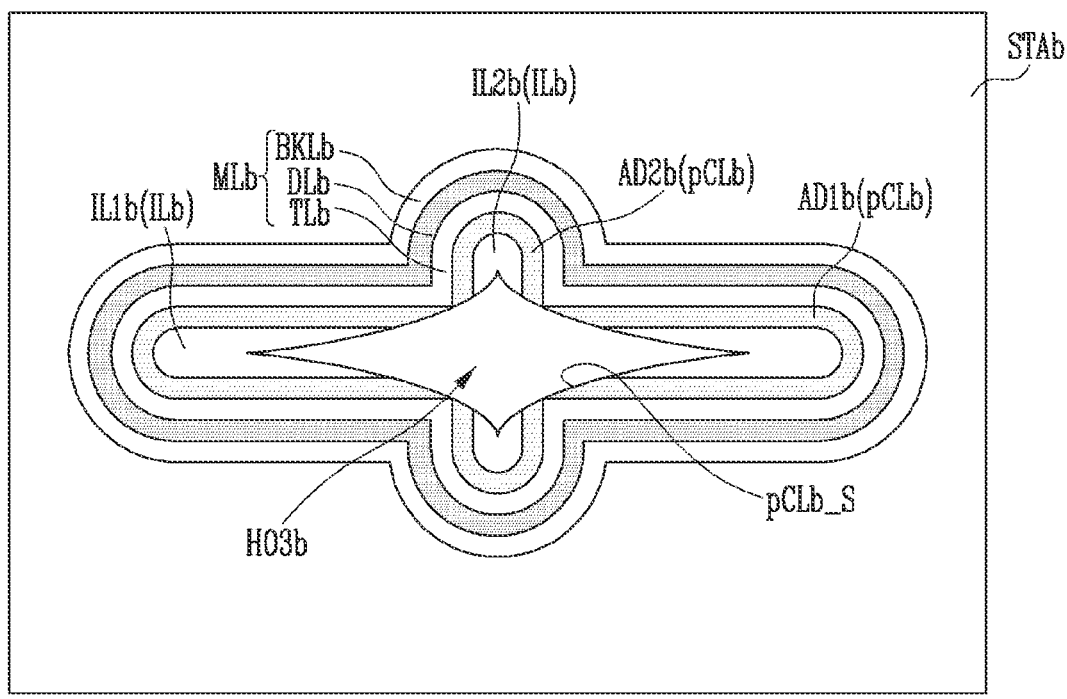

Referring to FIG. 8C, the second hole HO2b may be expanded. The expanded second hole HO2b may be defined as a third hole HO3b. The preliminary interposed layer pILb and the preliminary channel layer pCLb may be etched, and thus the second hole HO2b may be expanded. The preliminary interposed layer pILb may be etched, and may then be separated into first and second interposed layers IL1b and IL2b. The etched preliminary channel layer pCLb may include sidewalls exposed through the third hole HO3b. The preliminary channel layer pCLb may include a first adjacent part AD1b adjacent to the first interposed layer IL1b and a second adjacent part AD2b adjacent to the second interposed layer IL2b.

Figure 8D:
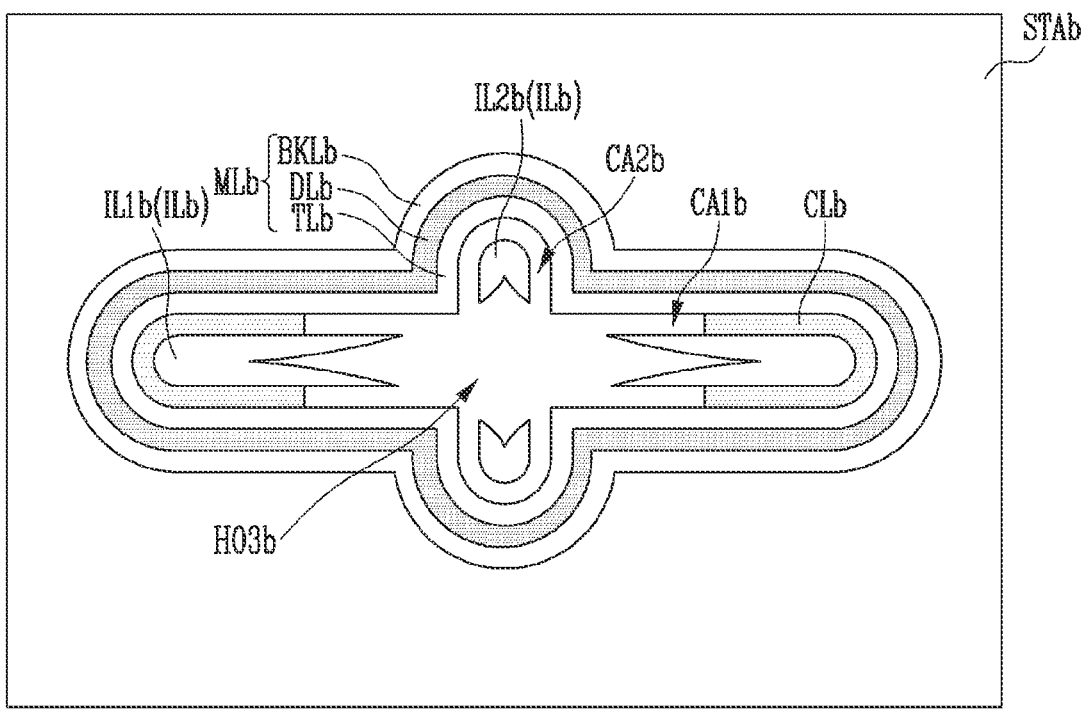

Referring to FIG. 8D, the preliminary channel layer pCLb may be selectively etched. As the preliminary channel layer pCLb is etched, a portion of the first adjacent part AD1b of the preliminary channel layer pCLb may be removed, and another portion of the first adjacent part AD1b of the preliminary channel layer pCLb may remain. The remaining portion of the first adjacent part AD1b of the preliminary channel layer pCLb may be defined as the channel layer CLb. An empty space formed by removing the portion of the first adjacent part AD1b of the preliminary channel layer pCLb may be defined as first cavities CA1b. The first cavities CA1b may be defined between the tunnel insulating layer TLb of the memory layer MLb and the first interposed layer ILib.

As the preliminary channel layer pCLb is etched, a second adjacent part AD2b of the preliminary channel layer pCLb may be removed. An empty space formed by removing the second adjacent part AD2b of the preliminary channel layer pCLb may be defined as second cavities CA2b. The second cavities CA2b may be defined between the tunnel insulating layer TLb of the memory layer MLbb and the second interposed layer IL2b. The second interposed layer IL2b may be enclosed with the second cavities CA2b and the third hole HO3b. In an embodiment, the second interposed layer IL2b may be surrounded with the second cavities CA2b and the third hole HO3b.

Then, a filling layer FIb may be formed in the third hole HO3b, the first cavities CA1b, and the second cavities CA2b (see FIG. 7). For example, the filling layer FIb may completely fill the third hole HO3b, the first cavities CA1b, and the second cavities CA2b. Portions of the filling layer FIb, which fill the first cavities CA1b, may be defined as first and second protrusions PT1b and PT2b, and portions of the filling layer FIb, which fill the second cavities CA2b, may be defined as round parts RPb (see FIG. 7).

Figure 9:
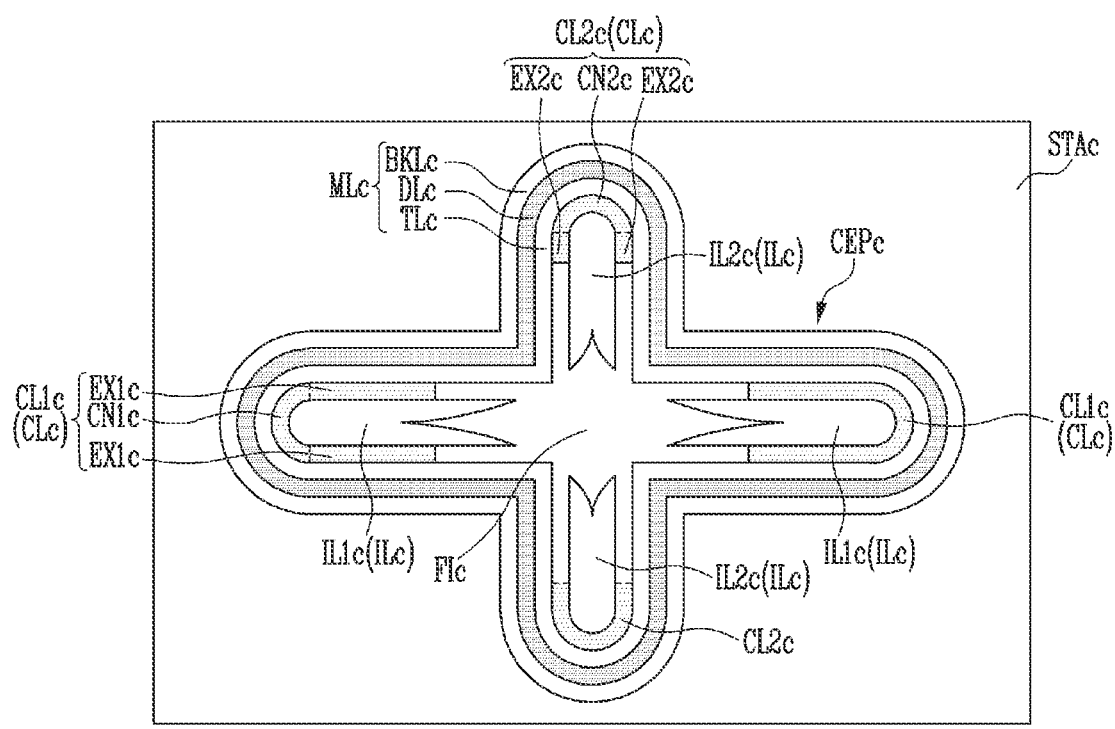
FIG. 9 is a plan view of a semiconductor device according to an embodiment of the present disclosure.

FIG. 9 is a plan view of a semiconductor device according to an embodiment of the present disclosure.

The semiconductor device according to FIG. 9 is similar to that illustrated in FIGS. 2A to 2D except for a configuration to be described below.

Referring to FIG. 9, the semiconductor device may include a cell plug CEPc passing through a stacked body STAc. The cell plug CEPc may include a filling layer FIc, interposed layers ILc coupled to the filling layer FIc, channel layers CLc coupled to the filling layer FIc, and a memory layer MLc configured to enclose the filling layer FIc, the interposed layers ILc, and the channel layers CLc. The memory layer MLc may include a tunnel insulating layer TLc, a data storage layer DLc, and a blocking layer BKLc. In an embodiment, the cell plug CEPc may include a filling layer FIc, interposed layers ILc coupled to the filling layer FIc, channel layers CLc coupled to the filling layer FIc, and a memory layer MLc configured to surround the filling layer FIc, the interposed layers ILc, and the channel layers CLc.

The channel layers CLc may include first channel layers CL1c and second channel layers CL2c. The first channel layers CL1c may be spaced apart from each other. In an example, the first channel layers CL1c may be spaced apart from each other in a first direction D1. The second channel layers CL2c may be arranged between the first channel layers CL1c. The second channel layers CL2c may be spaced apart from each other. In an example, the second channel layers CL2c may be spaced apart from each other in a second direction D2. The first channel layers CL1c may be arranged between the second channel layers CL2c.

Each of the first channel layers CL1c may include first extensions EX1c which extend in the first direction D1 and a first connector CN1c which couples the first extensions EX1c to each other. Each of the second channel layers CL2c may include second extensions EX2c which extend in the second direction D2, and a second connector CN2c which couples the second extensions EX2c to each other.

The maximum length of the first channel layer CL1c may be greater than the maximum length of the second channel layer CL2c. For example, the maximum length of the first channel layer CL1c in the first direction D1 may be greater than the maximum length of the second channel layer CL2c in the second direction D2. The maximum length of the first extension EX1c of the first channel layer CL1c may be greater than the maximum length of the second extension EX2c of the second channel layer CL2c. For example, the maximum length of the first extension EX1c of the first channel layer CL1c in the first direction D1 may be greater than the maximum length of the second extension EX2c of the second channel layer CL2c in the second direction D2.

The interposed layers ILc may include first interposed layers IL1c and second interposed layers IL2c. The first interposed layer IL1c may be coupled to the first channel layer CL1c. The second interposed layer IL2c may be coupled to the second channel layer CL2c. The first interposed layers IL1c may be spaced apart from each other. In an example, the first interposed layers IL1c may be spaced apart from each other in the first direction D1. The second interposed layers IL2c may be disposed between the first interposed layers IL1c. The second channel layers CL2c may be arranged between the first interposed layers IL1c. The second interposed layers IL2c may be spaced apart from each other. For example, the second interposed layers IL2c may be spaced apart from each other in the second direction D2. The first interposed layers IL1c may be disposed between the second interposed layers IL2c. The first channel layers CL1c may be disposed between the second interposed layers IL2c.

The maximum length of the first interposed layer IL1c may be greater than the maximum length of the second interposed layer IL2c. For example, the maximum length of the first interposed layer IL1c in the first direction D1 may be greater than the maximum length of the second interposed layer IL2c in the second direction D2.

FIGS. 10A, 10B, 10C, and 10D are plan views for explaining a method of manufacturing the semiconductor device of FIG. 9.

For simplicity of description, the same reference numerals are used to designate the components described with reference to FIG. 9, and repeated descriptions will be omitted.

A manufacturing method, which will be described below, is only one embodiment of a method of manufacturing the semiconductor device of FIG. 9, and the method of manufacturing the semiconductor device of FIG. 9 is not limited to the manufacturing method, which will be described below.

Figure 10A:
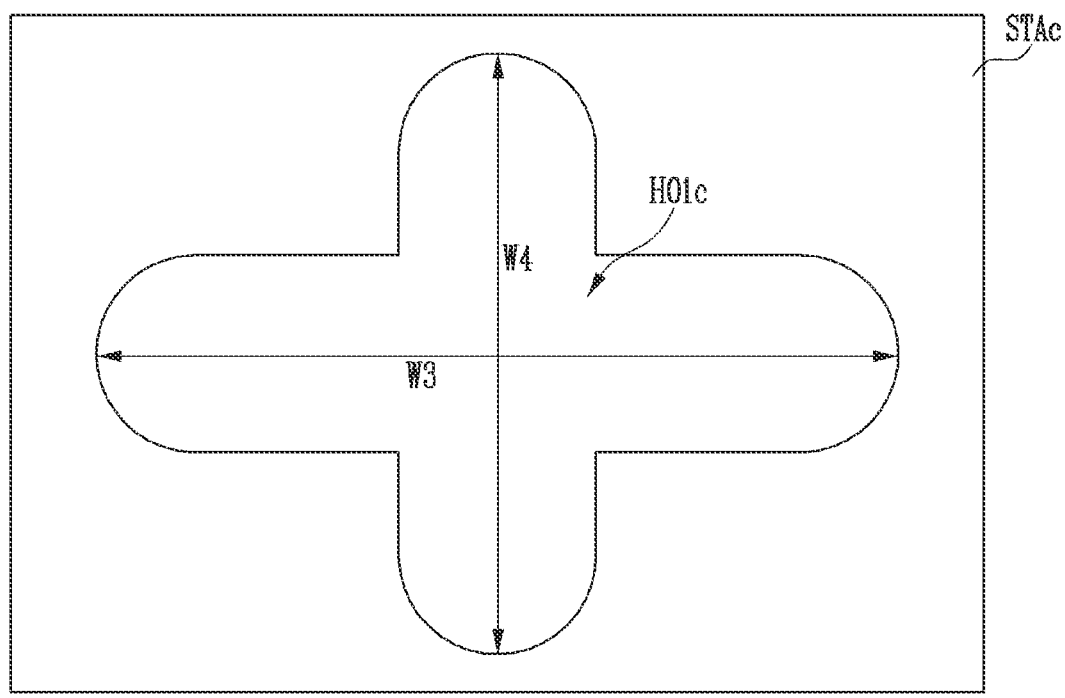

Referring to FIG. 10A, a first hole HO1c passing through a stacked body STAc may be formed. From the standpoint of a plane in FIG. 10A, the first hole HO1c may have the shape of a cross. For example, the maximum width W3 of the first hole HO1c in the first direction D1 may be greater than the maximum width W4 thereof in the second direction D2.

Referring to FIG. 10B, a memory layer MLc, a preliminary interposed layer pILc, and a preliminary channel layer pCLc may be formed in the first hole HO1c. The memory layer MLc, the preliminary interposed layer pILc, and the preliminary channel layer pCLc may be formed, and thus a second hole HO2c may be defined.

Figure 10C:
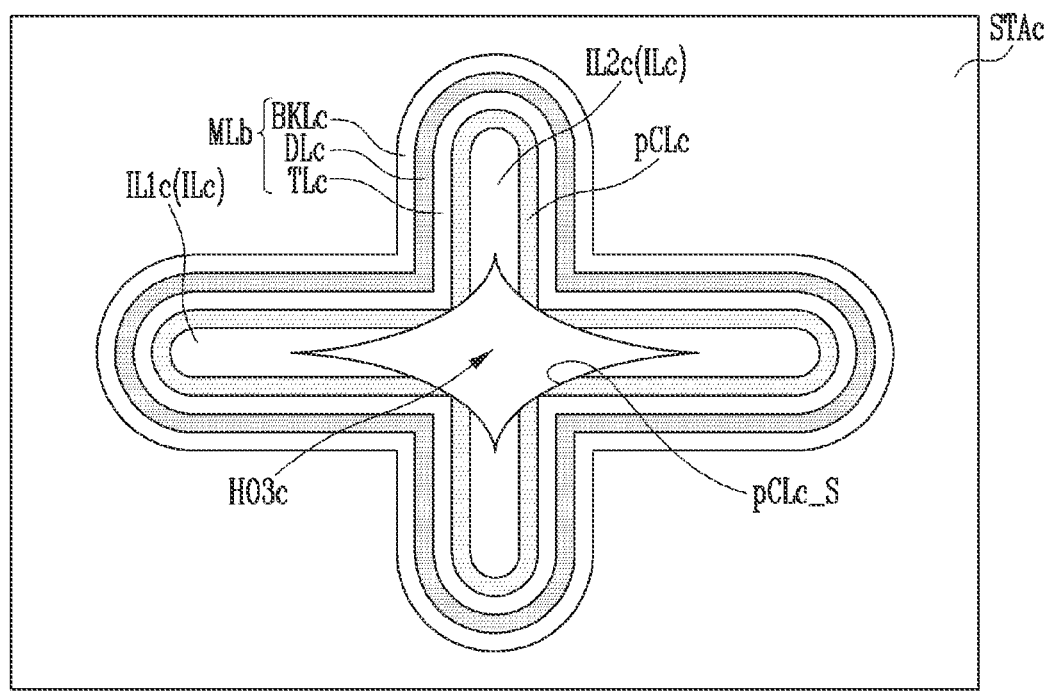

Referring to FIG. 10c, the second hole HO2c may be expanded. The expanded second hole HO2c may be defined as a third hole HO3c. The preliminary interposed layer pILc and the preliminary channel layer pCLc may be etched, and thus the second hole HO2c may be expanded. The preliminary interposed layer pILc may be etched, and may then be separated into first and second interposed layers IL1c and IL2c. The etched preliminary channel layer pCLc may include sidewalk pCLc_S exposed through the third hole HO3c.

Figure 10D:
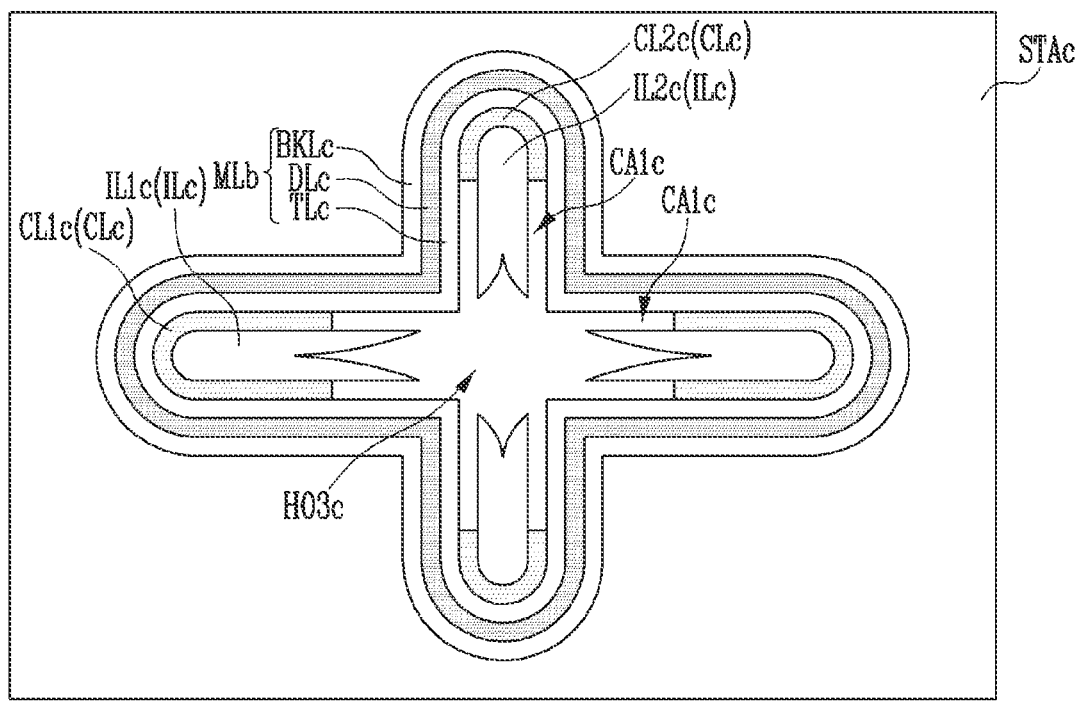

Referring to FIG. 10D, the preliminary channel layer pCLc may be selectively etched. As the preliminary channel layer pCLc is etched, the preliminary channel layer pCLc may be separated into first and second channel layers CL1c and CL2c. An empty space formed by etching the preliminary channel layer pCLc may be defined as first cavities CA1c.

Then, a filling layer FIc may be formed in the third hole HO3c and the first cavities CA1c (see FIG. 9).

Figure 11:
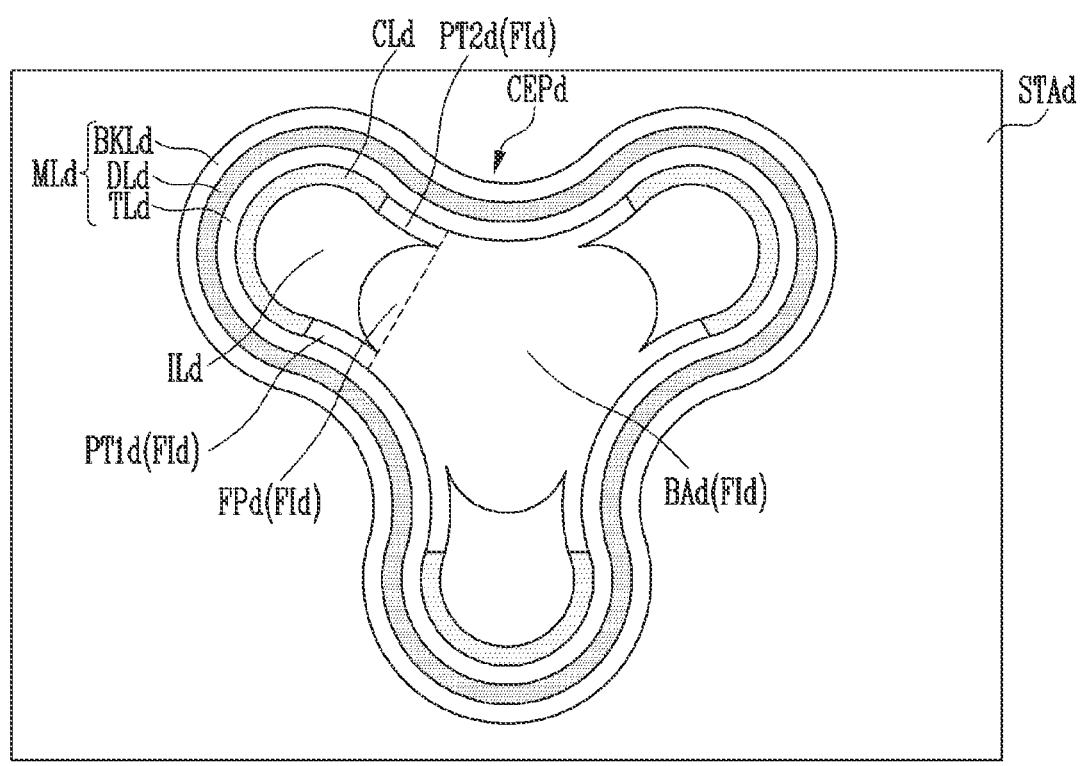
FIG. 11 is a plan view of a semiconductor device according to an embodiment of the present disclosure.

FIG. 11 is a plan view of a semiconductor device according to an embodiment of the present disclosure.

The semiconductor device in FIG. 11 may be similar to that illustrated in FIGS. 2A to 2D except for a configuration to be described below.

Referring to FIG. 11, the semiconductor device may include a cell plug CEPd passing through a stacked body STAd. The cell plug CEPd may include a filling layer FId, interposed layers ILd coupled to the filling layer FId, channel layers CLd coupled to the filling layer FId, and a memory layer MLd configured to enclose the filling layer FId, the interposed layers ILd, and the channel layers CLd. The memory layer MLd may include a tunnel insulating layer TLd, a data storage layer DLd, and a blocking layer BKLd. In an embodiment, the cell plug CEPd may include a filling layer FId, interposed layers ILd coupled to the filling layer FId, channel layers CLd coupled to the filling layer FId, and a memory layer MLd configured to surround the filling layer FId, the interposed layers ILd, and the channel layers CLd.

The channel layers CLd play be spaced apart from a center CE of the cell plug CEPd by the same interval. The channel layers CLd may be disposed to form a uniform angle using the center CE of the cell plug CEPd as the origin. For example, the channel layers CLd adjacent to each other may be disposed to form an angle of 120° using the center CE of the cell plug CEPd as the origin.

The interposed layers ILd may be spaced apart from a center CE of the cell plug CEPd by the same interval. The interposed layers ILd may be disposed to form a uniform angle using the center CE of the cell plug CEPd as the origin. For example, the interposed layers ILd adjacent to each other may be disposed to form an angle of 120° using the center CE of the cell plug CEPd as the origin.

The filling layer FId may include a base part BAd, first and second protrusions PT1d and PT2d coupled to the channel layer CLd, and a filling part FPd coupled to the first and second protrusions PT1d and PT2d.

FIGS. 12A, 12B, 12C, and 12D are plan views for explaining a method of manufacturing the semiconductor device of FIG. 11.

For simplicity of description, the same reference numerals are used to designate the components described with reference to FIG. 11 and repeated descriptions will be omitted.

A manufacturing method, which will be described below, is only one embodiment of the method of manufacturing the semiconductor device of FIG. 11, and the method of manufacturing the semiconductor device of FIG. 11 is not limited to the manufacturing method, which will be described below.

Figure 12A:
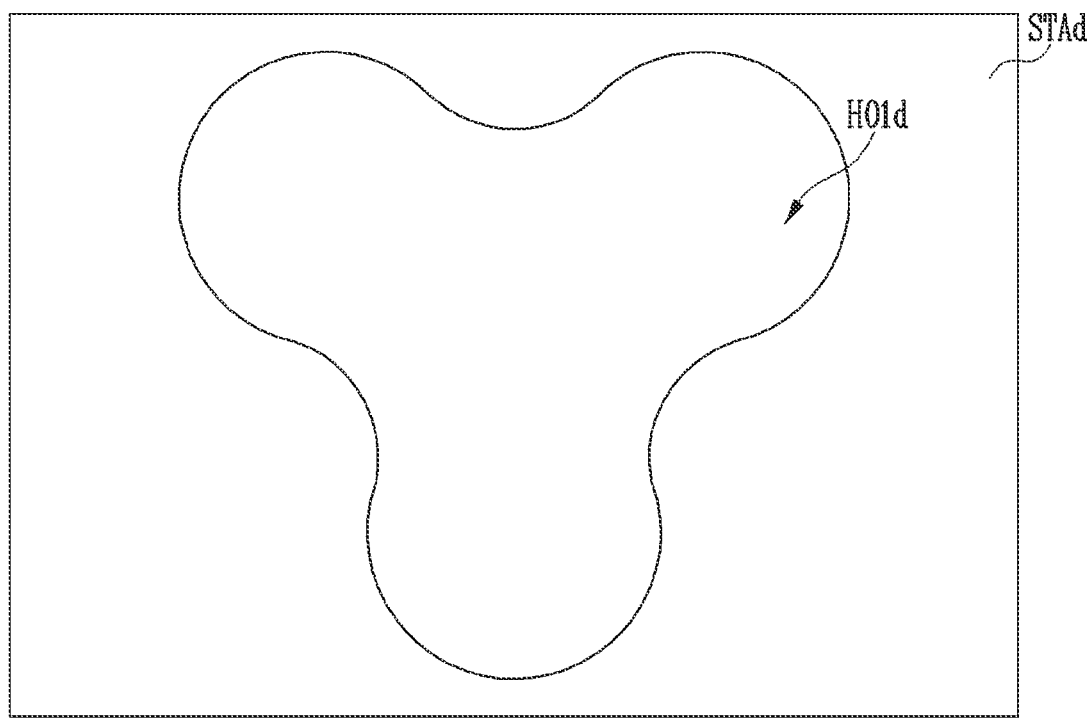
FIGS. 12A, 12B, 12C, and 12D are plan views for explaining a method of manufacturing the semiconductor device of FIG. 11.

Referring to FIG. 12A, a first hole HO1d passing through a stacked body STAb may be formed. From the standpoint of a plane in FIG. 12A, the first hole HO1d may have a shape protruding from the center of the first hole HO1d in three directions.

Figure 12B:
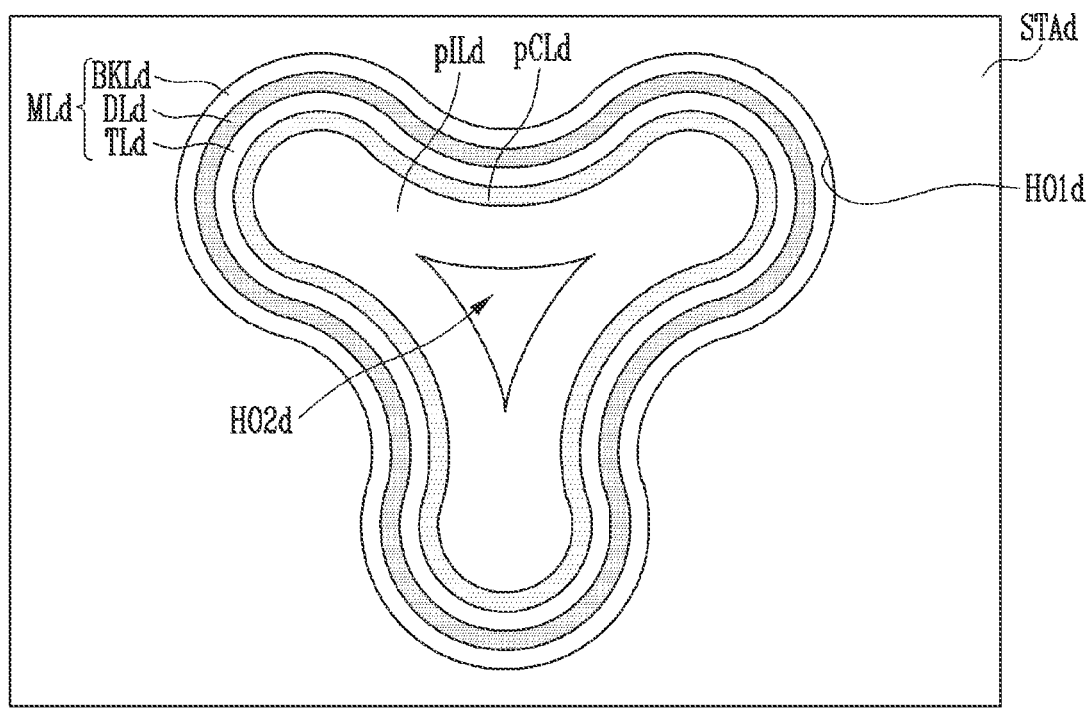

Referring to FIG. 12B, a memory layer MLd, a preliminary interposed layer pILd, and a preliminary channel layer pCLd may be formed in the first hole HO1d. The memory layer MLd, the preliminary interposed layer pILd, and the preliminary channel layer pCLd may be formed, and thus a second hole HO2d may be defined.

Figure 12C:
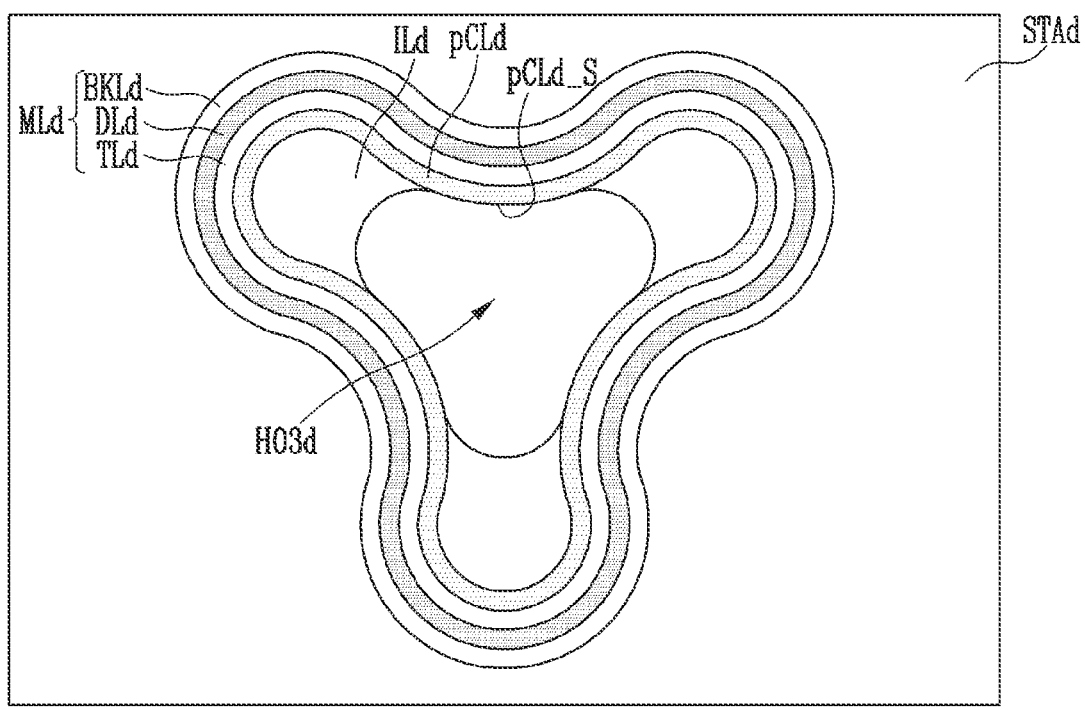

Referring to FIG. 12C, the second hole HO2d may be expanded. The expanded second hole HO2d may be defined as a third hole HO3d. The preliminary interposed layer pILd may be selectively etched, and thus the second hole HO2d may be expanded. The preliminary interposed layer pILd may be etched, and may then be separated into a plurality of interposed layers ILd. The preliminary interposed layer pILd may be etched, and then sidewalls pCLd_S of the preliminary channel layer pCLd may be exposed through the third hole HO3d.

Figure 12D:
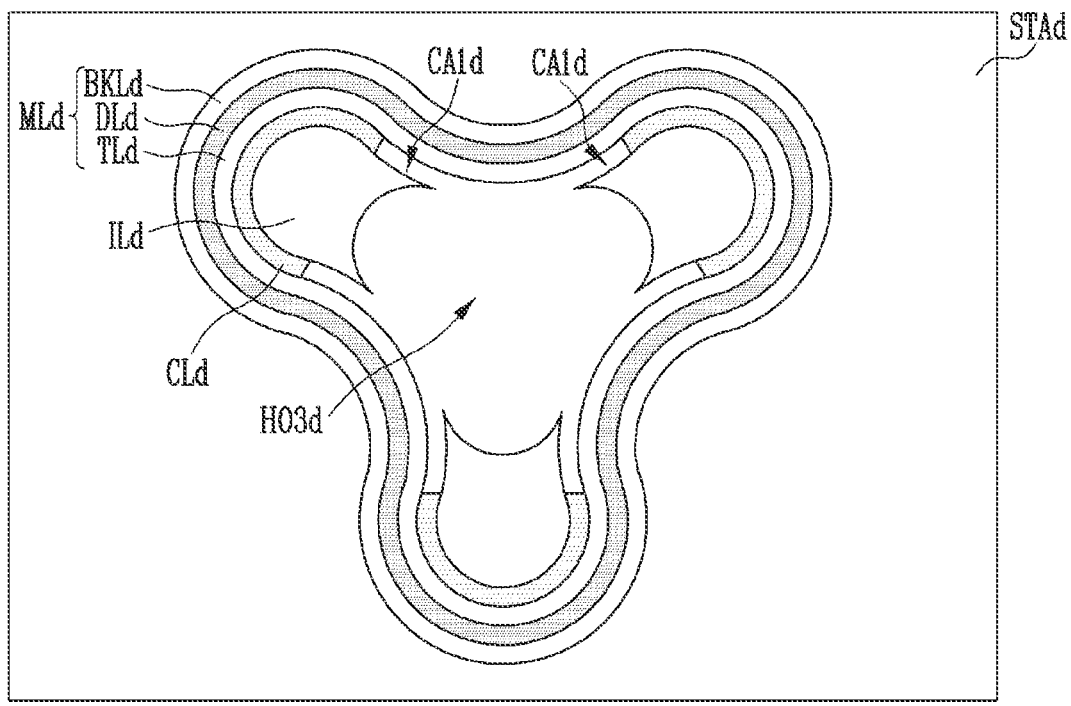

Referring to FIG. 12D, the preliminary channel layer pCLd may be selectively etched. As the preliminary channel layer pCLd is etched, the preliminary channel layer pCLd may be separated into a plurality of channel layers CLd. An empty space formed by etching the preliminary channel layer pCLd may be defined as first cavities CA1d.

Then, a filling layer FId may be formed in the third hole HO3d and the first cavities CA1d (see FIG. 11).

Figure 13:
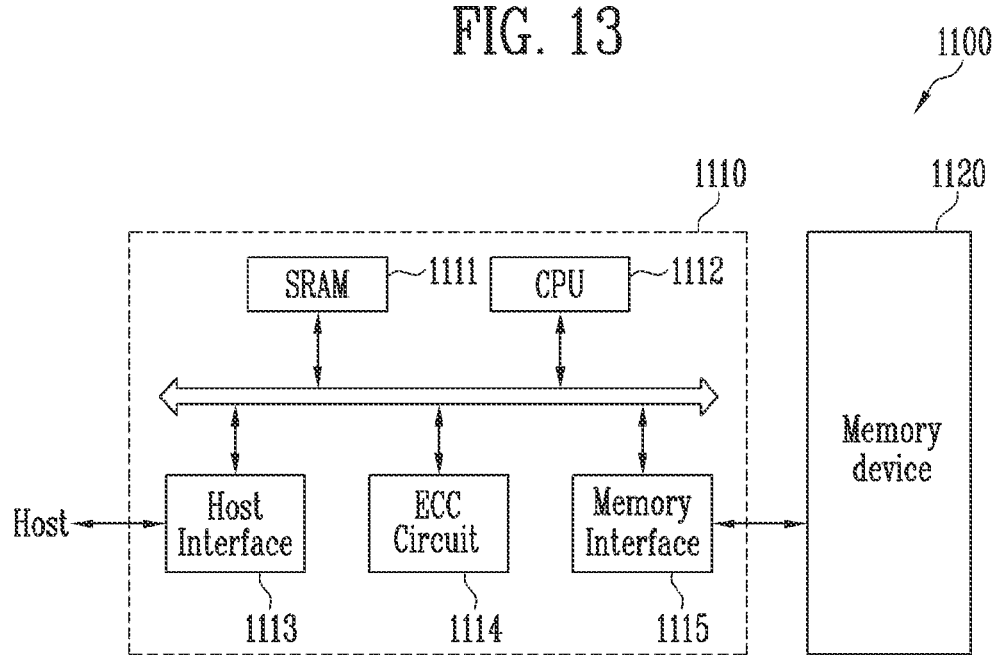
FIG. 13 is a block diagram illustrating the configuration of a memory system according to an embodiment of the present disclosure.

FIG. 13 is a block diagram illustrating the configuration of a memory system according to an embodiment of the present disclosure.

Referring to FIG. 13, a memory system 1100 according to an embodiment of the present disclosure includes a memory device 1120 and a memory controller 1110.

The memory device 1120 may include a semiconductor device according to the embodiment of the present disclosure. The memory device 1120 may be a multi-chip package composed of a plurality of flash memory chips.

The memory controller 1110 may control the memory device 1120, and may include a static random access memory (SRAM) 1111, a central processing unit (CPU) 1112, a host interface 1113, an error correction code (ECC) circuit 1114, and a memory interface 1115. The SRAM 1111 is used as a working memory of the CPU 1112, the CPU 1112 performs overall control operations for data exchange of the memory controller 1110, and the host interface 1113 is provided with a data interchange protocol of a host coupled to the memory system 1100. Further, the ECC circuit 1114 detects and corrects an error included in the data that is read from the memory device 1120, and the memory interface 1115 interfaces with the memory device 1120. In addition, the memory controller 1110 may further include a read only memory (ROM) or the like that stores code data for interfacing with the host.

The above-described memory system 1100 may be a memory card or a solid state drive (SSD) in which the memory device 1120 and the memory controller 1110 are combined with each other. For example, when the memory system 1100 is an SSD, the memory controller 1110 may communicate with an external device (e.g., host) via one of various s interface protocols, such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), or an Integrated Drive Electronics (IDE).

Figure 14:
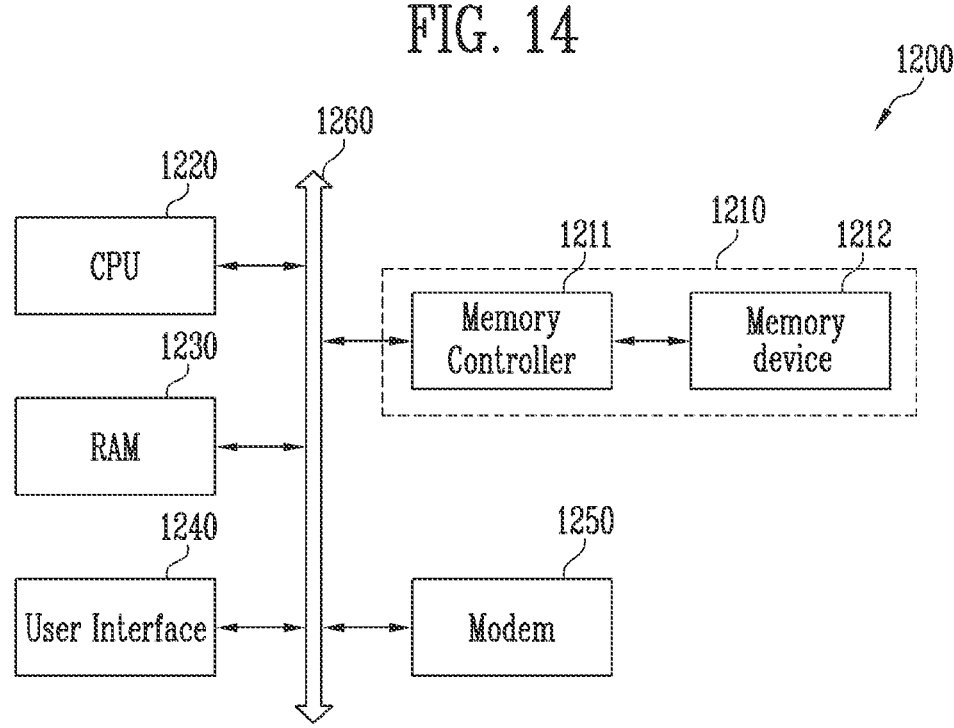
FIG. 14 is a block diagram illustrating the configuration of a computing system according to an embodiment of the present disclosure.

FIG. 14 is a block diagram showing the configuration of a computing system according to an embodiment of the present disclosure.

Referring to FIG. 14, a computing system 1200 according to an embodiment of the present disclosure may include a CPU 1220, a random access memory (RAM) 1230, a user interface 1240, a modern 1250, and a memory system 1210 that are electrically coupled to a system bus 1260. Also, when the computing system 1200 is a mobile device, it may further include a battery for supplying an operation voltage to the computing system 1200, and may further include an application chip set, a camera image processor (CIP), a mobile DRAM, etc.

The memory system 1210 may be configured using a memory device 1212 and a memory controller 1211 which are similar to those described with reference to FIG. 13.

The embodiments disclosed in the present specification and the drawings just aims to help those with ordinary knowledge in this art more clearly understand the present disclosure rather than aiming to limit the bounds of the present disclosure. It should be understood that many variations and modifications of the basic concepts described herein will s still fall within the spirit and scope of the present disclosure as defined in the appended claims and their equivalents.

In the semiconductor device according to embodiments of the present disclosure, a plurality of strings may be configured using one cell plug, thus improving the degree of integration of the semiconductor device.

What is claimed is:

1. A semiconductor device, comprising:
   a stacked body including conductive patterns and insulating patterns that are alternately stacked;
   a filling layer configured to pass through the stacked body;
   a first channel layer configured to pass through the stacked body and coupled to the filling layer;
   a second channel layer configured to pass through the stacked body and coupled to the filling layer;
   a first interposed layer configured to pass through the stacked body and disposed between the first channel layer and the filling layer;
   a second interposed layer configured to pass through the stacked body and disposed between the second channel layer and the filling layer; and
   a memory layer configured to surround the filling layer, the first and second channel layers, and the first and second interposed layers, wherein the memory layer includes a first blocking layer, a first data storage layer, and a first tunnel insulating layer adjacent to the first channel layer, and a second blocking layer, a second data storage layer, and a second tunnel insulating layer adjacent to the second channel layer,
   the first blocking layer and the second blocking layer are coupled to each other, the first data storage layer and the second data storage layer are coupled to each other, and the first tunnel insulating layer and the second tunnel insulating layer are coupled to each other, and
   an entirety of an inside wall of the first channel layer is in contact with the first interposed layer and an entirety of an inside wall of the second channel layer is in contact with the second interposed layer.

2. The semiconductor device according to claim 1, wherein:
   the first interposed layer is surrounded by the first channel layer and the filling layer, and
   the second interposed layer is surrounded by the second channel layer and the filling layer.

3. The semiconductor device according to claim 1, wherein:
   each of the first channel layer and the second channel layer has a shape of substantially a circular arc.

4. The semiconductor device according to claim 1, wherein:
   the first channel layer includes a first junction surface and a second junction surface that both contact with the filling layer, and the first interposed layer is disposed between the first junction surface and the second junction surface.

5. The semiconductor device according to claim 1, wherein:
the filling layer comprises a first protrusion and a second protrusion that both contact with the first channel layer, and
the first interposed layer is disposed between the first protrusion and the second protrusion.

6. The semiconductor device according to claim 5, wherein the filling layer further comprises a filling part disposed between the first protrusion and the second protrusion.

7. The semiconductor device according to claim 6, wherein:
a width of the filling part is smaller in a direction closer to the first channel layer.

8. The semiconductor device according to claim 6, wherein the first interposed layer comprises a first portion disposed between the first protrusion and the filling part and a second portion disposed between the second protrusion and the filling part.

9. The semiconductor device according to claim 8, wherein:
a width of the first portion of the first interposed layer is greater in a direction closer to the first channel layer, and
a width of the second portion of the first interposed layer is greater in a direction closer to the first channel layer.

10. The semiconductor device according to claim 1, wherein a maximum length of the first interposed layer is greater than a maximum length of the second interposed layer.

11. A semiconductor device, comprising:
a stacked body including conductive patterns and insulating patterns that are alternately stacked;
a filling layer configured to pass through the stacked body;
a first channel layer configured to pass through the stacked body and coupled to the filling layer;
a second channel layer configured to pass through the stacked body and coupled to the filling layer;
a first interposed layer configured to pass through the stacked body and disposed between the first channel layer and the filling layer;
a second interposed layer configured to pass through the stacked body and disposed between the second channel layer and the filling layer; and
a memory layer configured to surround the filling layer, the first channel layer, and the second channel layer,
wherein the filling layer comprises a first protrusion and a second protrusion that both contact with the first channel layer,
wherein the first protrusion includes a first outside wall in contact with the memory layer and a first junction surface in contact with the first channel layer,
wherein the second protrusion includes a second outside wall in contact with the memory layer and a second junction surface in contact with the first channel layer,
wherein the first outside wall and the second outside wall are substantially parallel to each other, and
wherein the memory layer includes a first blocking layer, a first data storage layer, and a first tunnel insulating layer adjacent to the first channel layer, and a second blocking layer, a second data storage layer, and a second tunnel insulating layer adjacent to the second channel layer,
the first blocking layer and the second blocking layer are coupled to each other, the first data storage layer and the second data storage layer are coupled to each other, and the first tunnel insulating layer and the second tunnel insulating layer are coupled to each other, and
an entirety of an inside wall of the first channel layer is in contact with the first interposed layer and an entirety of an inside wall of the second channel layer is in contact with the second interposed layer.

12. The semiconductor device according to claim 11, wherein the first outside wall and the first junction surface intersect each other.

13. The semiconductor device according to claim 12, wherein the first outside wall and the first junction surface are substantially orthogonal to each other.

14. The semiconductor device according to claim 11, wherein the first interposed layer is disposed between the first junction surface and the second junction surface.

* * * * *